(12) United States Patent
Takeuchi et al.

(10) Patent No.: US 8,179,025 B1
(45) Date of Patent: May 15, 2012

(54) LEAD-FREE PIEZOCERAMIC MATERIALS

(75) Inventors: Ichiro Takeuchi, Berwyn Heights, MD (US); Fujino Shigehiro, Nagoya (JP); Makoto Murakami, Ann Arbor, MI (US); Sung Hwan Lim, Hillsboro, OR (US); Daisuke Kan, Silver Spring, MD (US)

(73) Assignee: University of Maryland College Park, College Park, MD (US)

( * ) Notice: Subject to any disclaimer, the term of this patent is extended or adjusted under 35 U.S.C. 154(b) by 508 days.

(21) Appl. No.: 12/393,274

(22) Filed: Feb. 26, 2009

Related U.S. Application Data

(60) Provisional application No. 61/032,464, filed on Feb. 29, 2008, provisional application No. 61/032,467, filed on Feb. 29, 2008.

(51) Int. Cl.
*H01L 41/187* (2006.01)
(52) U.S. Cl. ........................................ 310/358
(58) Field of Classification Search ............... 310/358; 252/62.9 R, 62.9 PZ
See application file for complete search history.

(56) References Cited

U.S. PATENT DOCUMENTS

| | | | |
|---|---|---|---|
| 4,400,642 A | 8/1983 | Kiraly | |
| 4,560,737 A | 12/1985 | Yamamoto et al. | |
| 5,230,921 A | 7/1993 | Waltonen et al. | |
| 5,595,677 A | 1/1997 | Neurgaonkar et al. | |
| 5,607,632 A | 3/1997 | Neurgaonkar et al. | |
| 5,621,264 A | 4/1997 | Epstein et al. | |
| 5,637,542 A | 6/1997 | Takenaka | |
| 5,914,068 A | 6/1999 | Hiratani et al. | |
| 6,004,474 A | 12/1999 | Takenaka et al. | |
| 6,093,338 A | 7/2000 | Tani et al. | |
| 6,231,779 B1 | 5/2001 | Chiang et al. | |
| 6,358,433 B1 | 3/2002 | Tan et al. | |
| 6,447,887 B1 | 9/2002 | Claus et al. | |
| 6,507,476 B1 | 1/2003 | Shaw et al. | |
| 6,515,404 B1 | 2/2003 | Wong | |
| 6,793,843 B2 | 9/2004 | Furukawa et al. | |
| 6,987,433 B2 | 1/2006 | Larson, III et al. | |
| 7,090,785 B2 | 8/2006 | Chiang et al. | |
| 7,145,198 B2 | 12/2006 | Sakashita et al. | |
| 7,309,644 B2 | 12/2007 | Takeuchi et al. | |
| 7,468,143 B2 | 12/2008 | Takeda | |
| 7,479,728 B2 | 1/2009 | Murai et al. | |
| 2006/0131627 A1* | 6/2006 | Kondo et al. | 257/295 |
| 2007/0029593 A1* | 2/2007 | Ramesh | 257/295 |
| 2007/0045595 A1* | 3/2007 | Kondo | 252/500 |
| 2007/0228318 A1 | 10/2007 | Yuuya | |

OTHER PUBLICATIONS

Saito, Y. et al. (2004) "Lead-Free Piezoceramics," Nature, 432:84-87.
Setter N. et al., (2000) "Electroceramic Materials," Acta Mater., 48:51-178.
Shrout T.R., et al., (2007) "Lead-Free Piezoelectric Ceramics: Alternatives for PZT?" J Electroceram 19:111-124.
Silevitch, D.M. et al. (2007) "A Ferromagnet in a Continuously Tunable Random Field," Nature, 448 (7153):567-570.

(Continued)

*Primary Examiner* — Derek Rosenau
(74) *Attorney, Agent, or Firm* — William C. Schrot; Jeffrey I. Auerbach; The Auerbach Law Firm, LLC

(57) ABSTRACT

The present invention relates to lead-free piezoelectric ceramic materials comprising crystalline (and preferably perovskite crystalline) structures of the formula $Bi_{1-x}(RE)_xFeO_3$, where RE is one or more of La, Pr, Nd, Pm, Sm, Eu, Gd, Tb, Dy, Ho, Er, Tm, Yb and Lu, and $0 \leq x \leq 0.3$. The materials are at or near the morphotropic phase boundary and display enhanced piezoelectric and dielectric properties.

15 Claims, 15 Drawing Sheets

OTHER PUBLICATIONS

Suchomel, M.R. et al. (2004) "Predicting the Position of the Morphotropic Phase Boundary in High Temperature PbTiO3-Bi(B'B"")O3-Based Dielectric Ceramics," J. Appl. Phys. 96:4405-4410.

Sulyanov, S.N. et al. (1994) "Using a Two-Dimensional Detector for X-ray Powder Diffractometry," J. Appl. Cryst. 27:934-942.

Takahashi R. et al., (2004) "Design of Combinational Shadow Masks for Complete Ternary-Phase Diagramming of Solid State Materials," J. Comb. Chem. 6(1):50-53.

Takeuchi I. et al., (Mar. 2003) "Identification of Novel Compositions of Ferromagnetic Shape-Memory Alloys Using Composition Spreads," Nature Publishing Group, Nature Materials, 2:180-184.

Tanigawa, H. et al. (Epub Nov. 12, 2008) "Dynamical Pinning of a Domain Wall in a Magnetic Nanowire Induced by Walker Breakdown," Phys. Rev. Lett. 101(20):207203.

Troiler-McKinstry, N.B. et al. (2006) "Piezoelectric Nonlinearity Due to Motion of 180° Domain Walls in Ferroelectric Materials at Subcoercive Fields: A Dynamic Poling Model," Appl. Phys. Lett. 88:202901-1 to 202901-3.

Uchida, H. et al. (2006) "Crystal Structure and Ferroelectric Properties of Rare-Earth Substituted BiFeO3 Thin Films," J. Appl. Phys. 100:014106-1 to 014106-9.

van Dover R.B. et al., (Mar. 12, 1998) "Discovery of a Useful Thin-Film Dielectric Using a Composition-Spread Approach," MacMillan Publishers, Nature, 392:162-164.

Vanderbilt, D. et al. (2001) "Monoclinic and Triclinic Phases in Higher Order Devonshire Theory," Phys. Rev. B. 63:094108-1 to 094108-9.

Villegas, M. et al., (2004) "Electrical Properties of Bismuth Titanate Based Ceramics with Secondary Phases," Journal of Electroceramics, 13:543-548.

von. Hippel, A. (1950) "Ferroelectricity, Domain Structure, and Phase Transitions of Barium Titanate," Rev. Modern Phys., 22:221-237.

Wang, J. et al. (2003) "Epitaxial BiFeO3 Multiferroic Thin Film Heterostructures," Science 299:1719-1722.

Woodward, D. et al. (2005) "Review of Crystal and Domain Structures in the PbZrxTi1-xO3 Solid Solution," Phys. Rev. B. 72:104110-1 to 104110-8.

Wu L. et al. (2007) "Influences of Morphotropic Phase Boundaries on Physical Properties in (K,Na,Li) Nb0.80Ta0.20O3 Ceramics," J. Phys. D: Appl. Phys. 40:3527-3530.

Yu et al. (2003) "Electrical Properties and Electric Field-Induced Antiferroelectric-Ferroelectric Phase Transition in Nd3 +− Doped Lead Strontium Zirconate Titanate Ceramics," J. Appl. Phys. 94:7250-7255.

Yuan et al. (2006) "Multiferroicity in Polarized Single-Phase Bi0.875Sm0.125FeO3 Ceramics," J. Appl. Phys. 100:024109-1 to 024109-5.

Yuan et al. (2006) "Structural Transformation and Ferroelectromagnetic Behavior in Single-Phase Bi1—xNdxFeO3 Multiferroic Ceramics," Appl. Phys. Lett. 89:052905-1 to 052905-5.

Zhang et al. ((2007) "Giant Strain in Lead-Free Piezoceramics Bi0.5Na0.5TiO3-BaTiO3-K0.5Na0.5NbO3 System," Appl. Phys. Lett. 91:112906-1 to 112906-3.

Zhang et al. (2006) "Substitution-induced phase transition and enhanced multiferroic properties of Bi1—xLaxFeO3 ceramics," Appl. Phys. Lett. 88:162901-1 to 162901-3.

Zhao T. et al., (Oct. 2006) "Electrical Control of Antiferromagnetic Domains in Multiferroic BiFeO3 Films at Room Temperature," Nature Publishing Group, Nature Materials, 5:823-829.

Zheng R.Y. et al., (2008) "Electrical and Magnetic Properties of Multiferroic BiFeO3/CoFe2O4 Heterostructure," Journal of Applied Physics 104:034106-1 to 034106-6.

Zubko P. et al., (2007) "Strain-Gradient-Induced Polarization in SrTiO3 Single Crystals," Physical Review Letters, 99:167601.

Fujino, S. et al. (2007) "Ferroelectric Properties of Multiphase Bi-Fe-O Thin Films," Solid State Ionics 178:1257-1261.

Ahart M. et al., (Jan. 2008) "Origin of Morphotropic Phase Boundaries in Ferroelectrics," Nature Publishing Group, 451:545-549.

Bedau, D. et al. (Epub Dec. 18, 2008) "Quantitative Determination of the Nonlinear Pinning Potential for a Magnetic Domain Wall," Phys. Rev. Lett. 101(25):256602.

Berlincourt, D. et al. (1963) "Release of Electric Energy in PbNb(Zr, Ti, Sn)O3 by Temperature- and by Pressure-Enforced Phase Transitions," Appl. Phys. Lett. 3:90-92.

Bhattacharya K. et al., (2003) "Ferroelectric Perovskites for Electromechanical Actuation," Science Direct, Acta Materialia 51:5941-5960.

Bousquet E. et al., (Apr. 10, 2008) "Improper Ferroelectricity in Perovskite Oxide Artificial Superlattices," Nature Publishing Group, 452:732-737.

Cheng et al. (2008) "Ferroelectric Properties of Bi3.4Dy0.6Ti3O12 Thin Films Crystallized in N2," Materials Lett. 62:2450-2453.

Chiang et al. (1998) "Lead-Free High Strain Single Crystal Piezoelectrics in the Alkaline-Bismuth-Titanate Perovskite Family," Appl. Phys. Lett. 73:3683-3685.

Cordero F. et al., (2007) "Low-Temperature Phase Transformations of PbZr1-xTix03 in the Morphotropic Phase-Boundary Region," The American Physical Society, Physical Review Letters, 255701-1 to 255701-4.

Cui J. et al., (Apr. 2005) "Combinatorial Search of Thermoelestic Shape-Memory Alloys with Extremely Small Hysteresis Width," Nature Publishing Group, Nature Materials, 5:286-290.

Dalziel J.A.W. et al., (Mar. 13, 1960) "The Perovskite-Type Structures of DyAlO3, DyFeO3, and Some Related Lanthanon Mixed Oxides," Acta Cryst. 13:956-958.

Demartin-Maeder M. et al., (2004) "Lead Free Piezoelectric Materials," Journal of Electroceramics, 13:385-392.

Du H. et al., (2007) "Microstructure, Piezoelectric, and Ferroelectric Properties of Bi2O3-Added (K0.5Na0.5) NbO3 Lead-Free Ceramics," J. Am. Ceram. Soc. 90[9]:2824-2829.

Du H. et al., (2007) "Phase Structure, Microstructure, and Electrical Properties of Bismuth Modified Potassium-Sodium Niobium Lead-Free Ceramics," Journal of Applied Physics 102:054102-1 to 054102-5.

Fong D.D. et al., (Jun. 11, 2004) "Ferroelectricity in Ultrathin Perovskite Films," sciencemag.org, Science, 304:1650-1653.

Frantti, J. (May 29, 2008) "Notes of the Recent Structural Studies on Lead Zirconate Titanate," Journal of Physical Chemistry, the American Chemical Society, 112(21):6521-6535.

Fu, H. et al. (2000) "Polarization Rotation Mechanism for Ultrahigh Electromechanical Response in Single-Crystal Piezoelectrics," Nature, 403:281-283.

Fujitsu Press Release, (Mar. 28, 2008), Fujitsu Laboratories Ltd. University of Tokyo.

Fukumura, T. et al. (2000) "Rapid Construction of a Phase Diagram of Doped Mott Insulators With a Composition-Spread Approach," Appl. Phys. Lett. 77:3426-3428.

Guo, R. et al. (2000) "Origin of the High Piezoelectric Response in PbZr1-xTixO3," Phys. Rev. Lett. 84:5423-5426.

Hasegawa K. et al., (2004) "Amorphous Stability of HfO2 Based Ternary and Binary Composition Spread Oxide Films as Alternative Gate Dielectrics," Science Direct, Applied Surface Science, 223:229-232.

Hollenstein, E. et al. (2005) "Piezoelectric Properties of Li- and Ta-Modified (K0.5Na0.5)NbO3," Appl. Phys. Lett. 87:182905-1 to 182905-3.

Jin, Y.M. et al. (2003) "Adaptive Ferroelectric States in Systems with Low Domain-Wall Energy: Tetragonal Microdomains," J. Appl. Phys., 94:3629-3640.

Jin, Y.M. et al. (2003) "Conformal Miniaturization of Domains With Low Domain-Wall Energy: Monoclinic Ferroelectric States Near the Morphotropic Phase Boundaries," Phys. Rev. Lett., 91:197601-1 to 197601-4.

Kakimoto K. et al., (2002) "Control of Crystal Orientation and Piezoelectric Response of Lead Zirconate Titanate Thin Films Near the Morphotropic Phase Boundary," J. Am. Ceram. Soc. 85[4]:1019-1021.

Kalinin S.V. et al. (2006) "A Decade of Piezoresponse Force Microscopy: Progress, Challenges, and Opportunities," IEEE Trans. Ultrason. Ferroelectr. Freq. Control. 53(12):2226-2252.

Koinuma H. et al., (Jul. 2004) "Combinatorial Solid-State Chemistry of Inorganic Materials," Nature Publishing Group, Nature Materials, 3:429-438.

Lasave J. et al., (2007) "Origin of Anitferroelectricity in NH4H2PO4 From First Principles," The American Physical Society, Physical Review Letters, 267601-1 to 267601-4.

Lee WH. et al., (2000) "Dysprosium Doped Dielectric Materials for Sintering in Reducing Atmospheres," Journal of Electroceramics, 5:1, 31-36.

Lim SH. et al., (2007) "The Effects of Multiphase Formation on Strain Relaxation and Magnetization in Multiferroic BiFeO3 Thin Films," Adv. Funct. Mater., 17:2594-2599.

Liu H. et al., (2008) "Antiferroelectriclike Hysteris Loops in PbTiO3/BiFeO3/PbTiO3 Sandwich Structural Films," Solid State Communications 147:433-435.

Lofland S.E. et al., (2006) "Epitaxy Texturing, and Second-Harmonic Generation in BiFeO3 Thin Films," The American Physical Society, 092408-1 to 092408-4.

Ma, H. et al. (Epub Nov. 20, 2003) "Lattice-Scale Domain Wall Dynamics in Ferroelectrics," Phys. Rev. Lett. 91 (21):217601.

Mathe, V.L. (2003) "Structural, Dielectric and Electrical Properties of SmxBi1-xFeO3 Ceramics," J. Magn. Magn. Mater. 263:344-352.

Murakami, M. et al. (2005) "Tunable Multiferroic Properties in Nanocomposite PbTiO3-CoFe2O4 Epitaxial Thin Films," Appl. Phys. Lett. 87:112901-1 to 112901-3.

Nagarajan, V. et al. (2002) "Realizing Intrinsic Piezoresponse in Epitaxial Submicron Lead Zirconate Titanate Capacitors on Si," Appl. Phys. Lett. 81:4215-4217.

Noheda, B. et al. (1999) "A Monoclinic Ferroelectric Phase in the Pb(Zr1-xTix)03 Solid Solution," Appl. Phys. Lett. 74:2059-2061.

Noheda, B. et al. (2000) "Stability of the Monoclinic Phase in the Ferroelectric Perovskite PbZr1-xTixO3," Phys. Rev. B. 63:014103-1 to 014103-1 to 014103-9.

Oh K.Y. et al., (1992). "Piezoelectricity in the Field-Induced Ferroelectricity Phase of Lead Zironate-Based Antiferroelectrics," J. Am. Ceram. Soc. 75(4):795-799.

Pan W.Y. et al., (Dec. 15, 1989) "Large Displacement Transducers Based on Electric Field Forced Phase Transistions in the Tetragonal (Pb0.97La0.02)(Ti,Zr,Sn)O3 Family of Ceramics," J. Appl. Phys. 66(12):6014-6023.

Pandey, D. et al., (2008) "Stability of Ferroic Phases in the Highly Piezoelectric Pb(ZrxTi1-x)O3 Ceramics," Acta Cryst. A64:192-203.

Park, S.E. et al. (1997) "Ultrahigh Strain and Piezoelectric Behavior in Relaxor Based Ferroelectric Single Crystals," J. Appl. Phys. 82:1804-1811.

"Piezoelectricity," Piezoelectric Ceramics: Principles and Applications.

Pintilie L. et al., (2008) "Coexistence of Ferroelectricity and Antiferroelectricity in Epitaxial PbZrO3 Films with Different Orientations," Journal of Applied Physics, 103:024101-1 to 024101-5.

Rabe, (Nov. 2002) "Think Locally, Act Globally," Nature Publishing Group, Nature Materials, 1:147-148.

Ramesh, R. et al. (2007) "Multiferroics: Progress and Prospects in Thin Films," Nature Materials 6:21-29.

Ravindran et al. ((2006) "Theoretical Investigation of Magnetoelectric Behavior in BiFeO3," Phys. Rev. B. 74:224412-1 to 224412-18.

Ren (2004) "Large Electric-Field-Induced Strain in Ferroelectric Crystals by Point-Defect-Mediated Reversible Domain Switching," Nature Materials, 3:91-94.

Sabolsky, E.M. et al. (2003) "Piezoelectric Properties of <001> Textured Pb(Mg1/3Nb2/3)03—PbTiO3 Ceramics," Appl. Phys. Lett. 78:2551-2553.

* cited by examiner

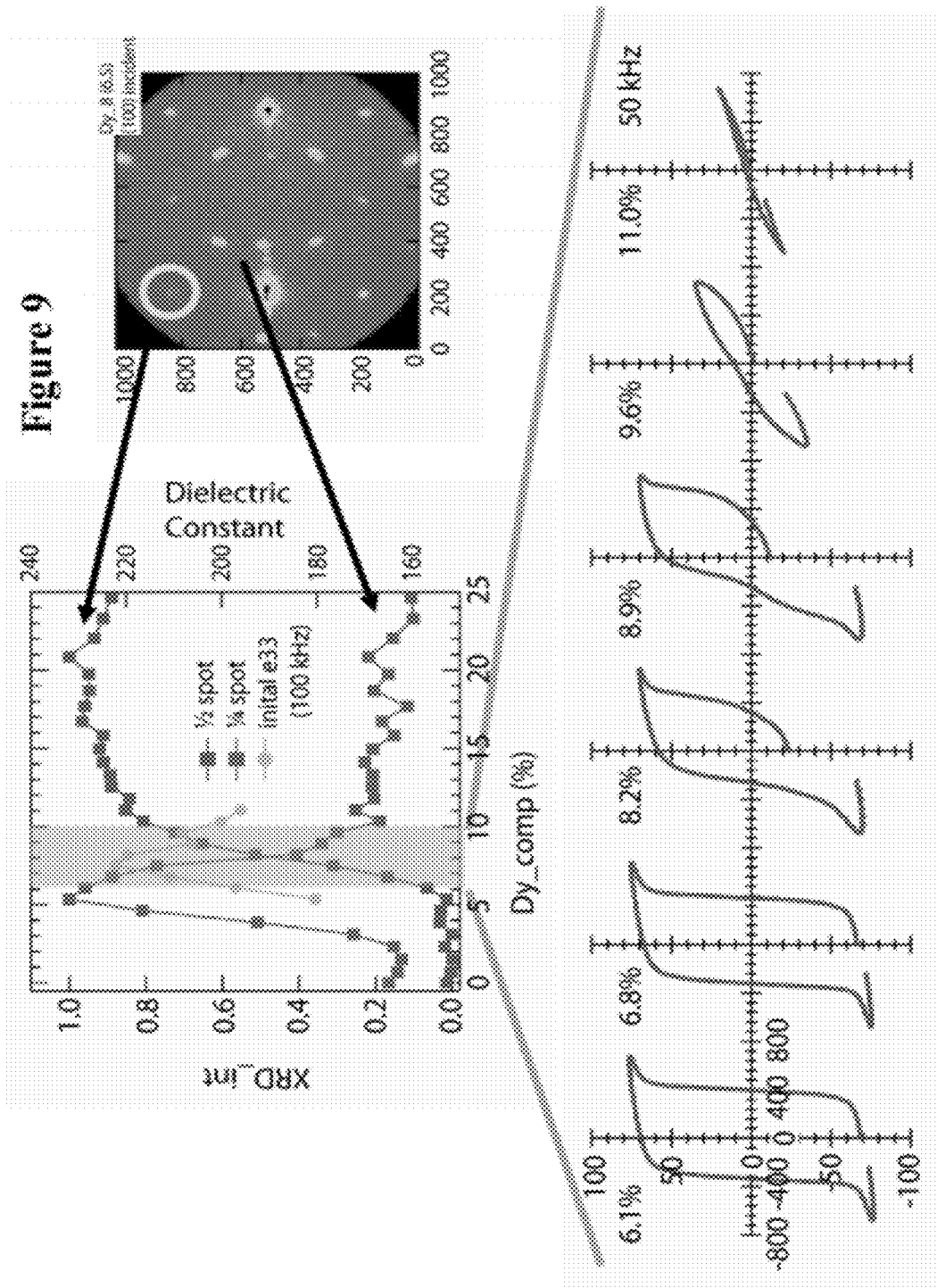

US 8,179,025 B1

LEAD-FREE PIEZOCERAMIC MATERIALS

CROSS-REFERENCE TO RELATED APPLICATIONS

This application claims priority to U.S. patent application Ser. Nos. 61/032,464 and 61/032,467 (both filed Feb. 29, 2008), both of which applications are herein incorporated by reference in their entireties.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of NSF DMR0094265 and NSF DMR0520471 awarded by the National Science Foundation.

BACKGROUND OF THE INVENTION

1. Field of the Invention

The present invention relates to lead-free piezoelectric ceramic materials comprising crystalline (and preferably perovskite crystalline) structures of the formula $Bi_{1-x}(RE)_xFeO_3$, where RE is one or more of La, Pr, Nd, Pm, Sm, Eu, Gd, Tb, Dy, Ho, Er, Tm, Yb and Lu, and $0 \leq x \leq 0.3$. The materials are at or near the morphotropic phase boundary and display enhanced piezoelectric and dielectric properties.

2. Description of Related Art

A. The Piezoelectric Effect and Piezoelectric Materials

Piezoelectricity relates to the ability of certain non-conductive crystalline materials to develop an electrical charge in response to and proportional to mechanical stress, and mechanically deform upon application of electric field Piezoelectric materials are discussed in U.S. Pat. Nos. 4,400,642; 4,560,737; 5,230,921; 5,621,264; 6,447,887; 6,515,404; 6,987,433; and 7,479,728.

A piezoelectric material consists of multiple interlocking domains which have positive and negative charges. These domains are symmetrical within the material, causing the material as a whole to be electrically neutral. When stress is put on the material, the symmetry is slightly broken, generating voltage. Even though a piezoelectric material never deforms by more than a few nanometers when a voltage is applied to it, the force behind this deformation is extremely high, on the order of mega-newtons. The property of piezoelectricity reflects both the atomic constituents of the material and the particular way in which the material was formed.

The piezoelectric effect is reversible in that materials exhibiting a direct piezoelectric effect (i.e., the production of electricity when stress is applied) also exhibit the reverse piezoelectric effect (i.e., the production of stress and/or strain when an electric field is applied).

Piezoelectric materials can be divided in 2 main groups: crystals and ceramics. Piezoelectric ceramics are composed of small grains (crystallites), each containing domains having aligned electric dipoles. Piezoceramic materials have several advantages over single crystals, including; higher sensitivity and the ability to be more easily fabricated into a desired shape and size. Piezoelectric ceramics are used in a broad range of applications due to their excellent properties of high sensitivity, ease of manufacture and the possibility of poling the ceramic in any direction. Applications of piezoceramics include accelerometers, acoustic emission transducers, actuators, alarm systems, speakers, movement detectors, broken window sensors, dental work: removal of plaque, flow meters: blood, industrial process, waste water; hydrophones: seismic, biologic, military, underwater communication; industrial sensors based on ultrasound: level control, detection, identification; inkjet printers; medical: scanning, heat treatment, surgical knives, cleaning blood veins; micro positioning devices: optics, scanning tunneling microscopes; musical instruments pickups; surface acoustic waves: personal computer touch screens, filters; underwater acoustics; and welding and drilling of metals and plastics. Piezoelectric ceramics are discussed in U.S. Pat. Nos. 5,637,542; 5,914,068; 6,004,474; 6,231,779; 6,358,433; 7,090,785; and 7,468,143.

B. Characteristics of Piezoelectric Materials

Normal ceramics are not piezoelectric because the random orientation of their individual crystallites imparts an infinite degree of rotational symmetry within the ceramic texture. In contrast, piezoelectric materials exhibit a substructure of electrically polar crystallite domains that can be reoriented by a strong applied electric field. This property is know as "ferroelectricity" (Batthais, B. T. et al. (1948) "*Domain Structure and Dielectric Response of Barium Titanate Single Crystals*," Phys. Rev. 73:1378-1384; von. Hippel, A. (1950) "*Ferroelectricity, Domain Structure, and Phase Transitions of Barium Titanate*," Rev. Modern Phys., 22:221-237).

This domain reorientation is demonstrated by the appearance of electric hysteresis and significant shape change in the presence of an electric field. When an electric field is applied to a ferroelectric material, the material expands if the field is parallel to the axis of the material's polarization, and contracts if the field is anti-parallel to this axis. This response is known as the "piezoresponse" of the material.

A ferroelectric material may also undergo a transition to an antiferroelectric state in a piezoceramic material. In an antiferroelectric transition, individual dipoles become arranged anti-parallel to adjacent dipoles with the result that the net spontaneous polarization is zero. Thus materials in their antiferroelectric states generally have low dielectric constants of about 100 to about 1000. This antiferroelectric phase may exist at room temperature, and is generally associated with a structural phase transition from the antiferroelectric state to a ferroelectric phase upon application of an electric field. Similarly, a ferroelectric-to-antiferroelectric phase transition may be accomplished by applying an activating electric field. Thus, piezoelectric materials are "field-tunable," such that they can undergo a phase transition from a low dielectric state (antiferroelectric state) to a high dielectric state (ferroelectric state) upon being exposed to a biasing electric field. These advantageous properties of the antiferroelectric particles permit the composition to be field tunable. Field tunable compositions can advantageously have their dielectric properties adjusted upon demand, depending upon the application for which they are to be used.

Ferroelectricity and antiferroelectricity can exist in a number of crystal structures and compositions within those structures. Among the most important of such structures are those capable of forming the crystal lattice structure of perovskite (CaTiO3), a non-ferroelectric material. "Perovskite-type" ceramic crystals have the general formula $ABO_3$, where A and B each represent cations and O represents oxygen. A and B differ in that A has a larger ionic radius than B and is in twelve-fold coordination, whereas B is in an octahedral six-fold coordination. Most of the useful piezoelectric and ferroelectric ceramics, such as barium titanate, (BaTiO3) potassium niobate (KNbO3), and lead titanate (PbTiO3) have perovskite-type structures. An example of a specific perovskite family comprises the structure RT3M, where R is a rare earth or other large ion, T is a transition metal ion, and M is a light metalloid. Perovskite materials exhibit colossal magnetoresistance, ferroelectricity, superconductivity, charge ordering, spin-dependent transport and high thermopower. They are thus exemplary candidates for memory devices and spintronics applications.

The piezoelectric effect for a given item depends on the type of piezoelectric material and the orientation of its mechanical and electrical axes of operation. In piezoceramics, these axes are set during the process, known as "poling, in which the ceramic's piezoelectric properties are induced. Under conditions that confer tetragonal or rhombohedral symmetry, each crystal has a dipole moment. At a particular temperature, known as the "critical temperature" ("$T_c$," or "Curie point") each perovskite crystal in the ceramic exhibits a simple cubic symmetry with no dipole moment. This phase change is accompanied by a peak in the dielectric constant and a complete loss of all piezoelectric properties. At temperatures below the Curie point, each crystal has tetragonal or rhombohedral symmetry and a dipole moment. However, the direction of polarization among neighboring domains is random, and so the ceramic element itself has no overall polarization.

In order to impart a permanent polarization to the ceramic element, it is necessary to subject the ceramic to a direct current ("DC") electric field. This "poling," process exposes the domains of the ceramic to a direct current electric field at a temperature slightly below the Curie point and thus causes the domains to align with one another. The domains that are most closely aligned with the electric field expand, and the ceramic lengthens in the direction of the field. When the field is removed, most of the dipoles remain locked into a near-alignment configuration, resulting in permanent polarization (the "remanent" polarization) and permanent elongation. The orientation of the direct current poling field determines the orientation of the mechanical and electrical axes. The poling field can be applied so the ceramic exhibits piezoelectric responses in various directions or combination of directions. The poling process permanently changes the dimensions of the ceramic.

Mechanical compression or tension on the poled piezoelectric ceramic changes its dipole moment and thus creates a voltage. Conversely, if a voltage is applied to a ceramic element in the direction of the poling voltage, the element will lengthen and its diameter will become smaller. If a voltage of opposite polarity to the poling voltage is applied, the element will become shorter and broader. If an alternating voltage is applied, the element will lengthen and shorten cyclically, at the frequency of the applied voltage. This principle is utilized in applications such as piezoelectric motors and sound/ultrasound generating devices.

The most useful piezoelectric/ferroelectric perovskite-type ceramics display a transition region (known as the "morphotropic phase boundary" or "MPB") in their composition phase diagrams. The morphotropic phase boundary separates regions of tetragonal symmetry from those of rhombohedral symmetry in compositionally varying ferroelectrics (Jaffe, B. et al. (1954) "*Piezoelectric Properties of Lead Zirconate-Lead Titanate Solid-Solution Ceramics,*" J. Appl. Phys. 25:809-810). At this transition region, the crystal structure changes abruptly and the electromechanical properties are maximal. It has been observed experimentally that the maximal values for dielectric permittivity, as well as the electromechanical coupling factors and piezoelectric coefficients of various piezoceramic compositions occur at the MPB.

Transitions through the MPB are sometimes mediated by intermediate phases of monoclinic symmetry (Noheda, B. et al. (1999) "*A Monoclinic Ferroelectric Phase in the Pb$(Zr_{1-x}Ti_x)O_3$ Solid Solution,*" Appl. Phys. Lett. 74:2059-2061.), and the high electromechanical response in this region is related to this phase transition because of symmetry-allowed polarization rotation (Guo, R. et al. (2000) "*Origin Of The High Piezoelectric Response In PbZr$_{1-x}$Ti$_x$O$_3$,*" Phys. Rev. Lett. 84:5423-5426; Noheda, B. et al. (1999) "*A Monoclinic Ferroelectric Phase in the Pb(Zr$_{1-x}$Ti$_x$)O$_3$ Solid Solution,*" Appl. Phys. Lett. 74:2059-2061; Fu, H. et al. (2000) "*Polarization Rotation Mechanism For Ultrahigh Electromechanical Response in Single-Crystal Piezoelectrics,*" Nature 403:281-283; Cohen, R. E. (2006) "*Relaxors Go Critical,*" Nature 441:941-942).

Lead oxide based piezoceramics, especially lead zirconate titanate (Pb(Zr,Ti)O$_3$) or "PZT" are presently the most widely used materials for piezoelectric actuators, sensors and transducers due to their excellent piezoelectric properties. Such piezoceramics exhibit some of the highest piezoelectric coefficients of any of the piezoceramic materials, and therefore, have been widely used in transducers, actuators and other electromechanical devices (Park et al. (1997) "*Ultrahigh Strain And Piezoelectric Behavior In Relaxor Based Ferroelectric Single Crystals,*" J. Appl. Phys. 82:1804-1811; Sabolsky, E. M. et al. (2003) "*Piezoelectric Properties Of <001> Textured Pb(Mg$_{1/3}$Nb$_{2/3}$)O$_3$—PbTiO$_3$ Ceramics,*" Appl. Phys. Lett. 78:2551-2553: Berlincourt, D. et al. (1963) "*Release Of Electric Energy In PbNb(Zr, Ti, Sn)O$_3$ By Temperature—And By Pressure-Enforced Phase Transitions,*" Appl. Phys. Lett. 3:90-92).

However, the lead oxide content of PZT is nearly 60 to 70% of its total mass. Lead oxide vaporizes during processing. Additionally, lead persists in the environment for extended time periods. It accumulates in living organisms, causing brain and nervous system damage. Lead oxide toxicity has therefore led to a growing concern about using lead oxides, particularly in consumer electronics. Additionally, lead-based materials are unsuitable for use at high temperatures (e.g., temperatures above 600° C.). Therefore, a need exists for lead-free ferroelectric/antiferroelectric materials capable of operating at high temperatures.

Recently, however, sodium bismuth titanate-based and sodium niobate-based materials have been proposed as alternatives to PZT (see U.S. Pat. No. 6,093,338; US Patent Publication No. 20070228318). U.S. Pat. No. 6,507,476 discloses a tunable ferroelectric capacitor that contains a mixture of sodium bismuth titanate, barium titanate, barium strontium niobate and potassium niobate. U.S. Pat. No. 6,793,843 discloses materials that contain sodium bismuth titanate, barium titanate and sodium niobate. However, one of the major obstacles to the use of these compounds as an alternative to PZT is their high current leakage which allows current to pass through them when a high voltage is applied. Attempts have been made to improve the electrical properties of such ceramics by doping the ceramics with rare earth elements such as lanthanum (La), samarium (Sm), gadolinium (Gd), terbium (Tb) and dysprosium (Dy) etc. To date, reported lead-free piezoceramics are either Aurivilius layered compounds or alkaline niobates (Saito, Y. et al. (2004) "*Lead-Free Piezoceramics,*" Nature 432:84-87; Demartin, M. et al. (2004) "*Lead Free Piezoelectric Materials,*" J. Electroceramics 13:385-392; Hollenstein, E. et al. (2005) "*Piezoelectric Properties Of Li- And Ta-Modified (K$_{0.5}$Na$_{0.5}$)NbO$_3$,*" Appl. Phys. Lett. 87:182905-1 to 182905-3) with complex crystal structures, which are difficult to synthesize.

While none of the presently available lead-free materials have been shown to match the overall performance of PZT, several classes of materials are now being considered as potentially attractive alternatives to PZT for special applications. The families of potassium sodium niobate and bismuth sodium titanate have the advantages of low density, low dielectric constants, high coupling coefficient (kt), and higher mechanical strength than lead-based ceramics, making them ideally suited for such applications as high frequency transducers. Additionally, their lower acoustical impedance and their low toxicity are advantageous. However, in order to capitalize on these advantages, it is necessary to carefully control their processing.

Thus, despite all such advances, a need exists for lead-free piezoceramic materials that display ferroelectric to antiferrolectric transitions, and display robust piezoelectric properties.

SUMMARY OF THE INVENTION

The present invention relates to lead-free piezoelectric ceramic materials comprising crystalline (and preferably perovskite crystalline) structures of the formula $Bi_{1-x}(RE)_xFeO_3$, where RE is one or more of La, Pr, Nd, Pm, Sm, Eu, Gd, Tb, Dy, Ho, Er, Tm, Yb and Lu, and $0 \leq x \leq 0.3$. The materials are at or near the morphotropic phase boundary and display enhanced piezoelectric and dielectric properties. Most preferably, the invention relates to such materials in which RE is Sm, and in which the ceramic has the formula: $Bi_{0.86}Sm_{0.14}FeO_3$.

In detail, the invention provides lead-free piezoelectric ceramic material having the formula:

where Bi is bismuth, Fe is iron, O is oxygen, RE is one or more of: La, Pr, Nd, Pm, Sm, Eu, Gd, Tb, Dy, Ho, Er, Tm, Yb and Lu, and wherein:
$0.125 \leq x \leq 0.3$ for La, Pr, Nd, or Pm;
$0.125 < x \leq 0.3$ for Sm; and
$0 < x \leq 0.3$ for Eu, Gd, Tb, Dy, Ho, Er, Tm, Yb or Lu.

The invention further pertains to the embodiment of such lead-free piezoelectric ceramic material, wherein the composition of the material is near its morphotropic phase boundary.

The invention further pertains to the embodiments of such lead-free piezoelectric ceramic materials, wherein RE is Sm. The invention further pertains to the embodiments of such lead-free piezoelectric ceramic materials, wherein $0.125 < x \leq 0.14$ and/or wherein the compound has an x value that is within 0.010 of the x value of the morphotropic phase boundary of such material, within 0.0005 of the x value of the morphotropic phase boundary of such material, or within 0.0002 of the x value of the morphotropic phase boundary of such material. The invention particularly pertains to the embodiments of such lead-free piezoelectric ceramic materials, wherein the lead-free piezoelectric ceramic material has the formula: $Bi_{0.86}Sm_{0.14}FeO_3$.

The invention further pertains to a device (especially a piezoelectric motor, a piezoelectric relay; a piezoelectric speaker; a piezoelectric sensor; a piezoelectric ultrasound sonic generator; or a piezoelectric pump) capable of generating a mechanical force in response to a change in an electric field, wherein the device contains a lead-free piezoelectric ceramic material having the formula:

$Bi_{1-x}RE_xFeO_3$ where Bi is bismuth, Fe is iron, O is oxygen, RE is one or more of: La, Pr, Nd, Pm, Sm, Eu, Gd, Tb, Dy, Ho, Er, Tm, Yb and Lu, and wherein:
$0.125 \leq x \leq 0.3$ for La, Pr, Nd, or Pm;
$0.125 < x \leq 0.3$ for Sm; and
$0 < x \leq 0.3$ for Eu, Gd, Tb, Dy, Ho, Er, Tm, Yb or Lu;
and wherein the response is a piezoresponse.

The invention further pertains to a device (especially, a piezoelectric sensor, a piezoelectric battery, a piezoelectric transducer, and a piezoelectric microphone) capable of generating a change in an electric field in response to a mechanical force, wherein the device contains a lead-free piezoelectric ceramic material having the formula:

where Bi is bismuth, Fe is iron, O is oxygen, RE is one or more of: La, Pr, Nd, Pm, Sm, Eu, Gd, Tb, Dy, Ho, Er, Tm, Yb and Lu, and wherein:
$0.125 \leq x \leq 0.3$ for La, Pr, Nd, or Pm;
$0.125 < x \leq 0.3$ for Sm; and
$0 < x \leq 0.3$ for Eu, Gd, Tb, Dy, Ho, Er, Tm, Yb or Lu;
and wherein the response is a piezoresponse.

The invention further pertains to the embodiments of such devices wherein RE is Sm, and/or wherein $0.125 < x \leq 0.14$. The invention further pertains to the embodiments of such devices wherein the compound has an x value that is within 0.002 of the x value of the morphotropic phase boundary of such material. The invention particularly pertains to the embodiments of such devices wherein the lead-free piezoelectric ceramic material has the formula: $Bi_{0.86}Sm_{0.14}FeO_3$.

BRIEF DESCRIPTION OF THE DRAWINGS

FIG. 2A: θ-2θ scan from 43° across a composition spread 6 mm long on (001) SrTiO3 was used for the initial screen in search of structural transitions. Typical film thickness is 200 nm. The gray line traces the (002) peak of $Bi_{1-x}Sm_xFeO_3$ except for the dotted region where the peak is obscured by the substrate peak. Continuous change in the lattice constant is observed. FIG. 2B: Two-dimensional diffraction images taken from x=0 to x=0.3 reveals appearance of the (1/2 0 2) and (−1/2 0 2) spots, indicating occurrence of lattice doubling at x≈0.14. $Bi_{1-x}Sm_xFeO_3$ goes from rhombohedral $BiFeO_3$ to orthorhombic $SmFeO_3$. The triclinic structure observed at the MPB x≈0.125 can be viewed as having a doubled distorted rhombohedral structure or a distorted pseudo-orthorhombic structure. The vertical nature of the boundary in temperature was confirmed up to 400° C. Similar results were obtained on (111) $LaAlO_3$ and (001) $(LaAlO_3)_{0.3}(Sr_2AlTaO_6)_{0.7}$ substrates which have different lattice constants and thus different epitaxial strains. Beyond x≈0.27, the compound was found to be paraelectric. FIG. 2C shows the predicted MPB values for other rare earth dopants as a function of ionic radius size.

sured at 5 kHz. In going from BiFeO$_3$, the coercive field decreases dramatically from 500 kV/cm to 150 kV/cm for Bi$_{0.88}$Fe$_{0.12}$O$_3$, while the relatively high polarization (≈75 μC/cm$^2$) is maintained. Beyond the MPB and before x=0.27, the material displays antiferroelectric characteristics (shown for x=0.16).

Figure 5:
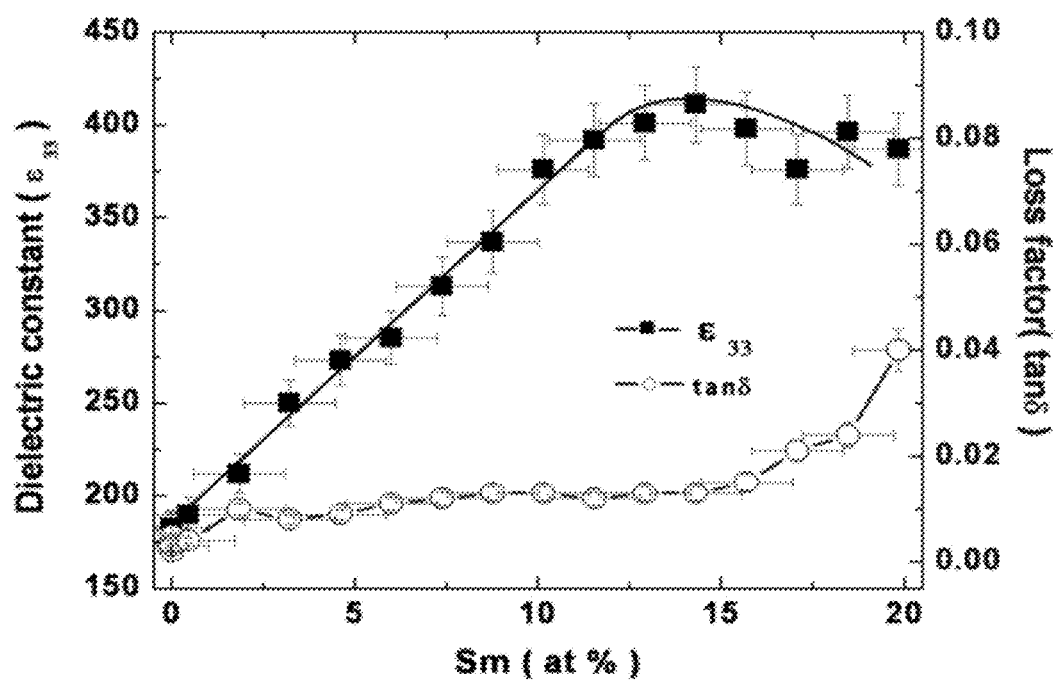

FIG. 5 shows the dielectric constant ($\epsilon_{33}$) and tan δ measured at 1 MHz. $\epsilon_{33}$ shows a broad peaking behavior as the Sm content is increased beyond x=0.14, while the loss tangent remains relatively low.

Figure 6A:
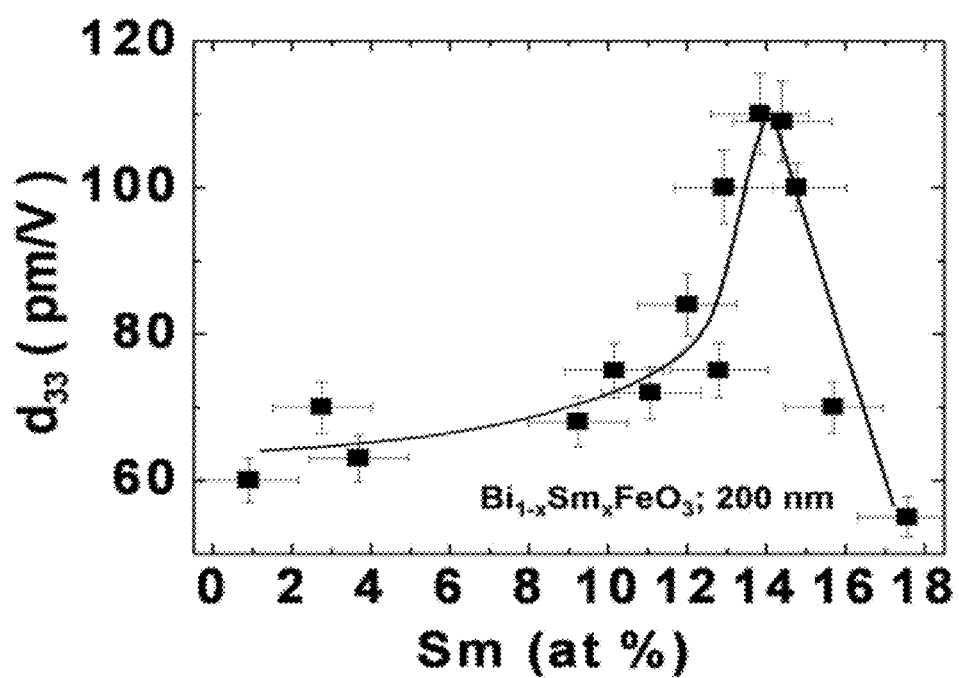
Figure 6B:
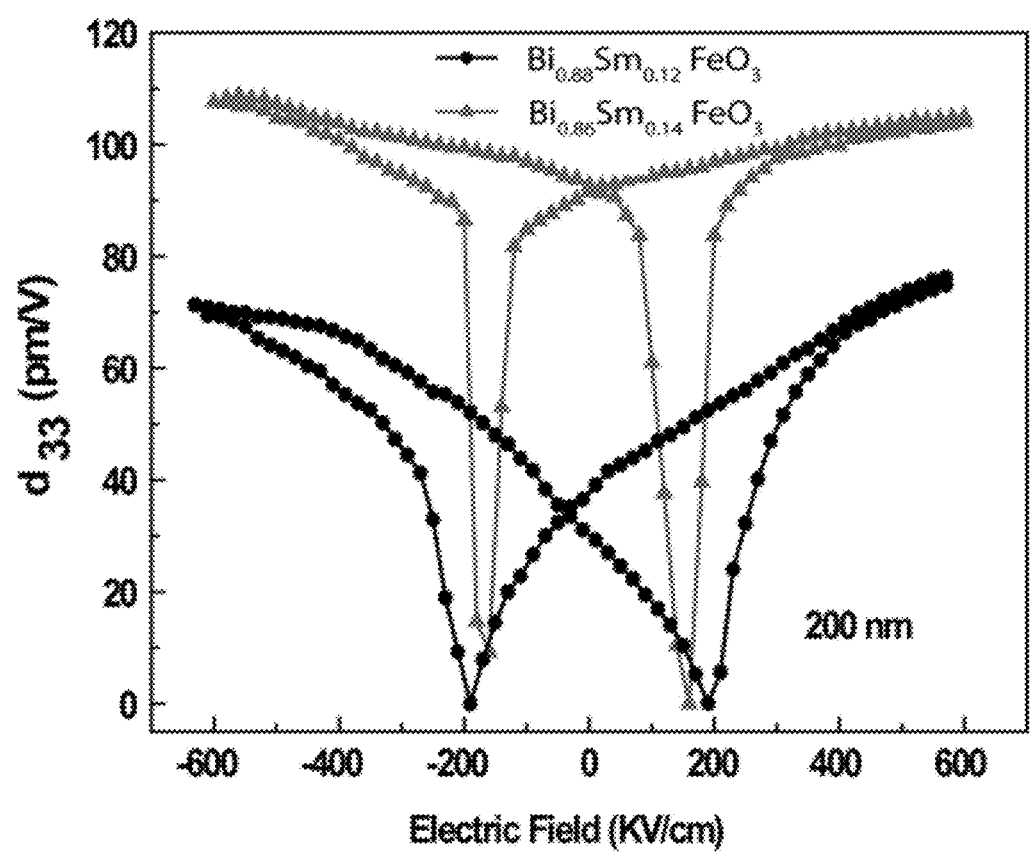
Figure 6C:
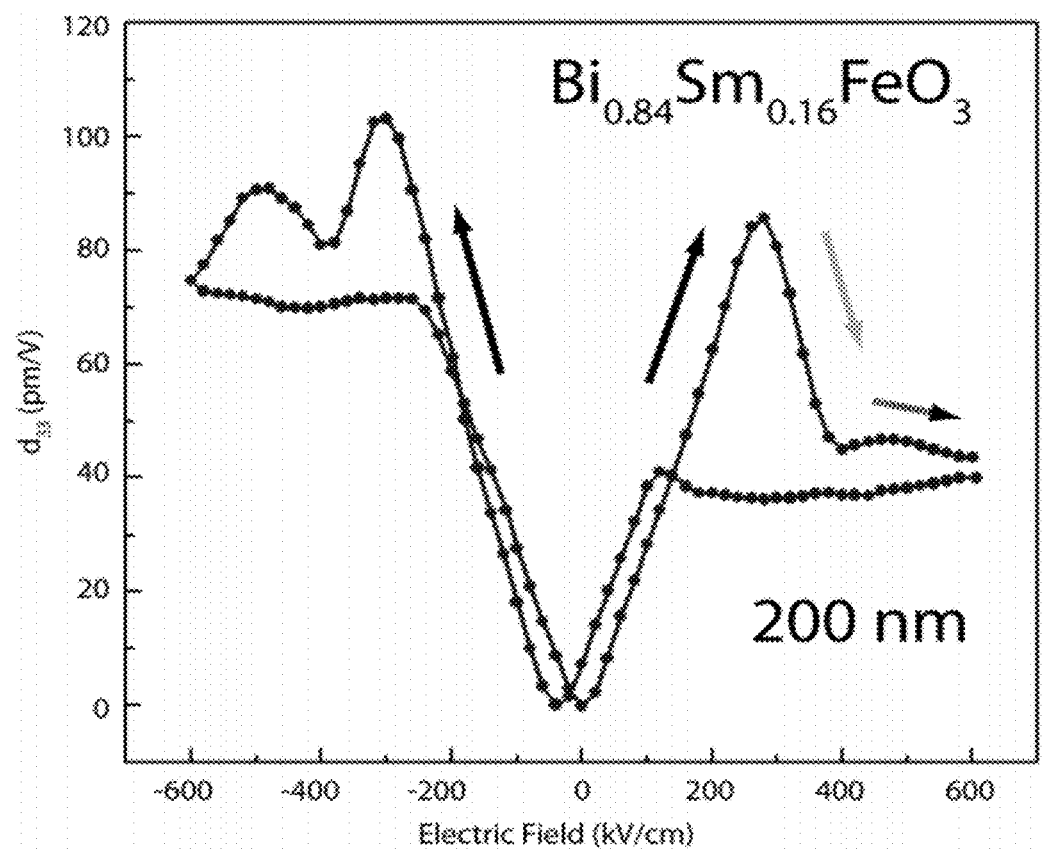

FIGS. 6A-6C show piezoelectric properties of Bi$_{1-x}$Sm$_x$FeO$_3$. FIG. 6A shows the high field piezoelectric coefficient (d$_{33}$) determined from the piezoelectric hysteresis loops measured as a function of composition. d$_{33}$ shows a sharp peak at x=0.12, while the coercive field drops below 100 kV/cm. FIG. 6B shows d$_{33}$ loops for Bi$_{0.88}$Sm$_{0.12}$FeO$_3$ and Bi$_{0.86}$Sm$_{0.14}$FeO$_3$. The high value of d$_{33}$ for Bi$_{0.88}$Sm$_{0.12}$Fe$_{0.12}$O$_3$ (110 pm/V) is comparable to that of PZT at the MPB. FIG. 6C shows the antiferroelectric d$_{33}$ loop observed for Bi$_{0.84}$Sm$_{0.16}$FeO$_3$.

Figure 7:
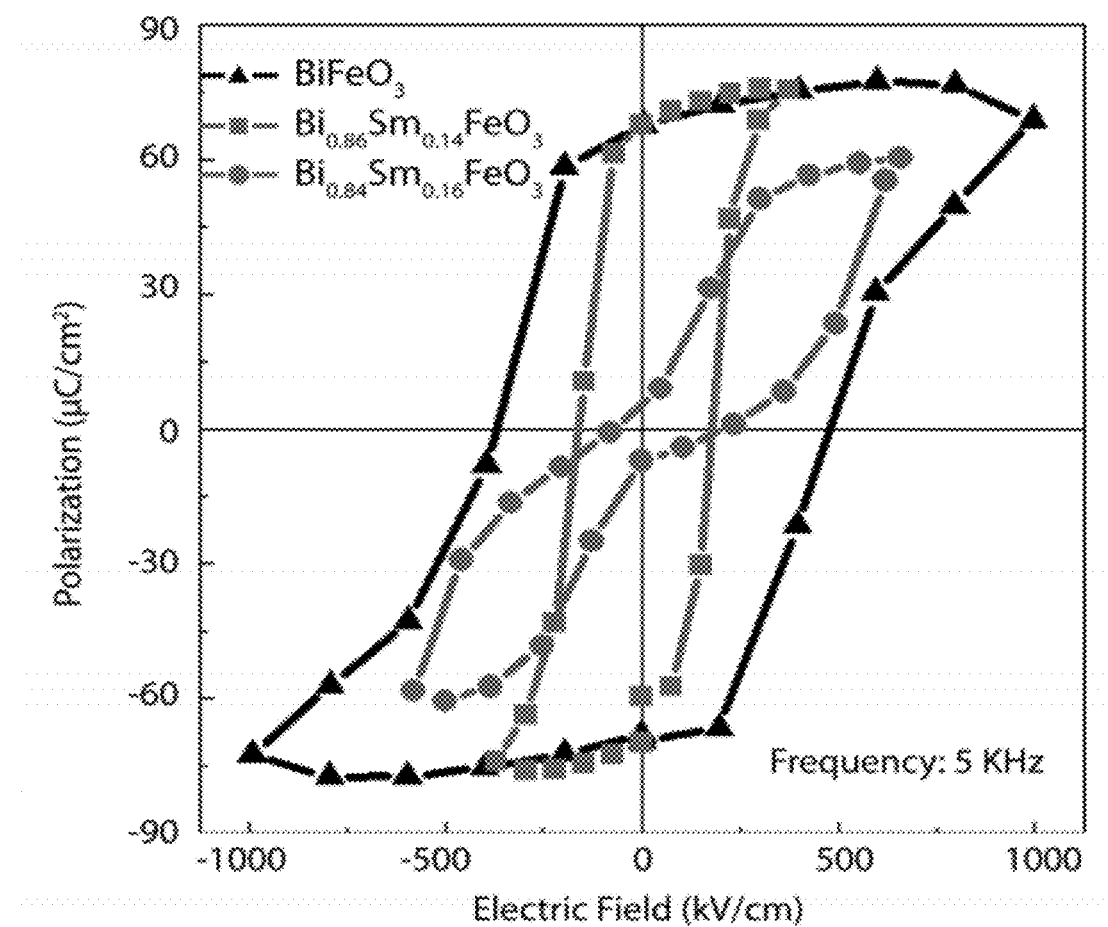

FIG. 7 shows the continuous change in the antiferroelectric hysteresis loops as a function of temperature for Bi$_{0.85}$Sm$_{0.15}$FeO$_3$. Loops are shown for 3 different temperatures. The composition undergoes an AFE to FE transition as the temperature is lowered.

Figure 8A:
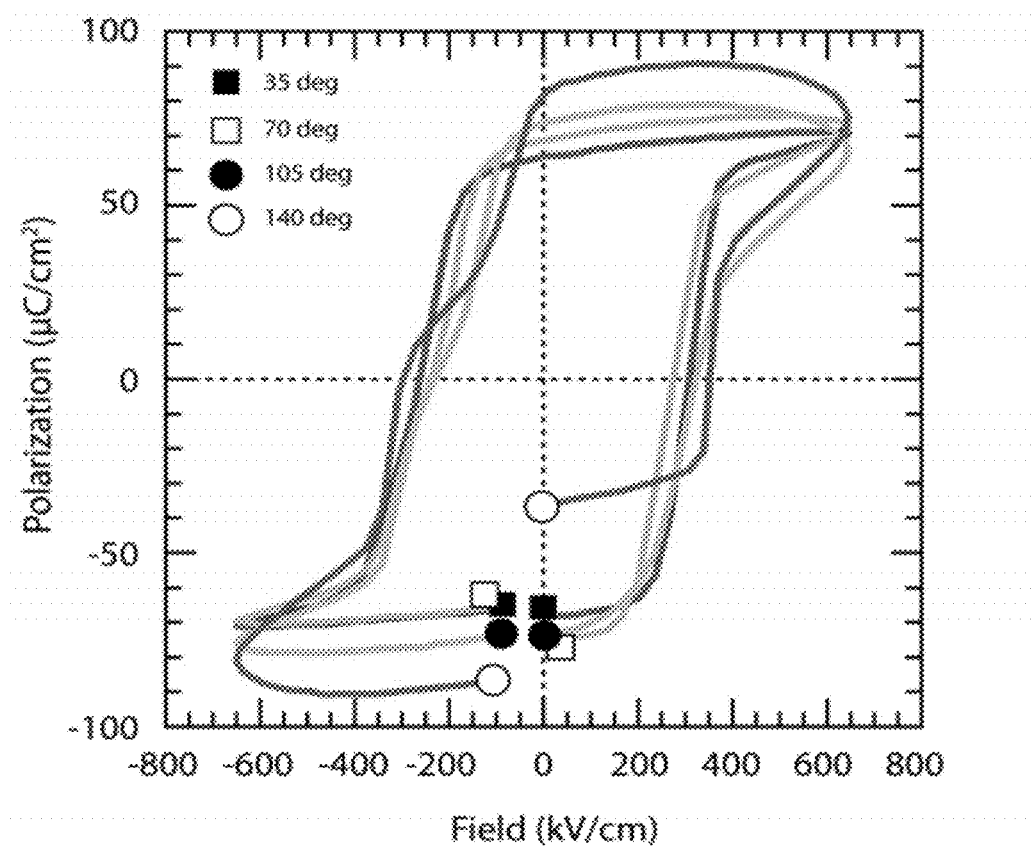
Figure 8B:
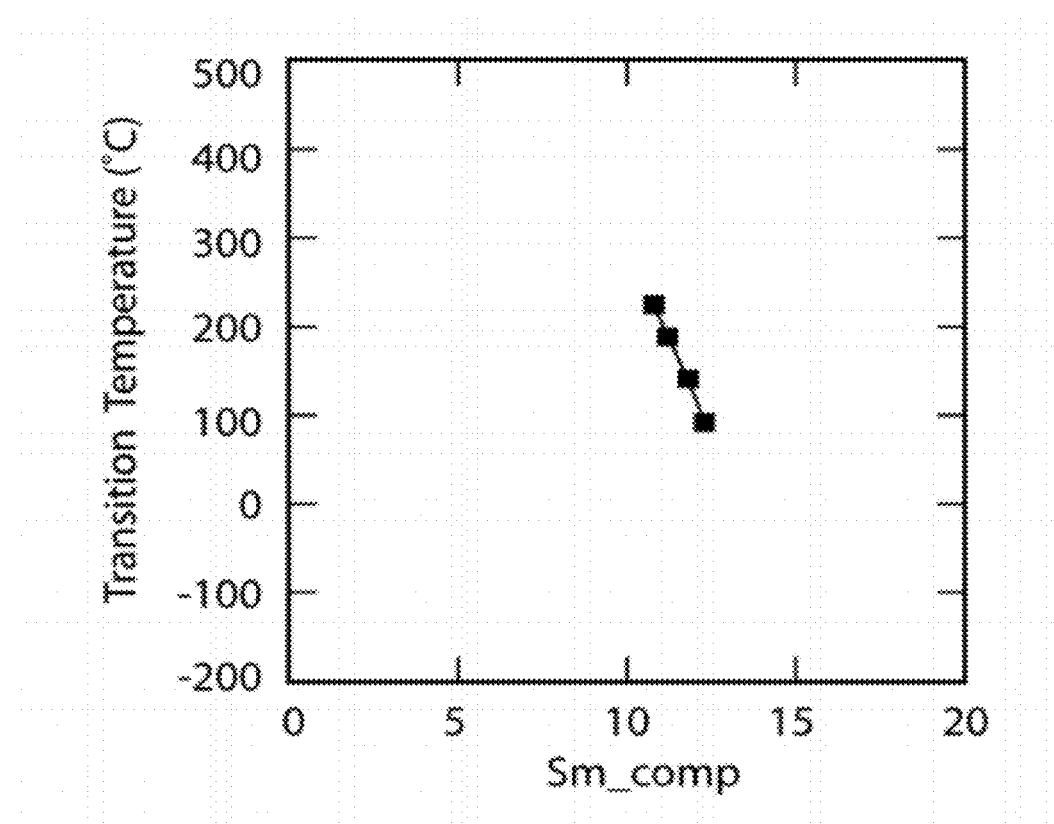

FIGS. 8A-8B. FIG. 8A shows the temperature-induced FE-AFE transition in Bi$_{0.877}$Sm$_{0.123}$FeO$_3$ thin films. At room temperature, the material exhibits typical FE hysteresis. As temperature is increased, AFE double-hysteresis is seen. FIG. 8B shows the temperature at which this FE to AFE transition takes place for different concentrations of Sm doping.

FIG. 9 shows the structural evolution for FE to AFE transition in Bi$_{1-x}$Dy$_x$FeO$_3$. The Circular image shows the diffraction (detailed) data which show the accompanying structural change with the FE to AFE transition. Upper left shows that various spots on the 2D X ray diffraction images develop and change as the composition is continuously changed. The ¼(011) peaks are an indication of classic AFE structure, similar to that seen for PbZrO$_3$. As the polarization hysteresis loop begins to change to that of the AFE structure polarization loop, this spot disappears and ½(010) spot appears, indicating a cell-doubling structural transition.

Figure 10:
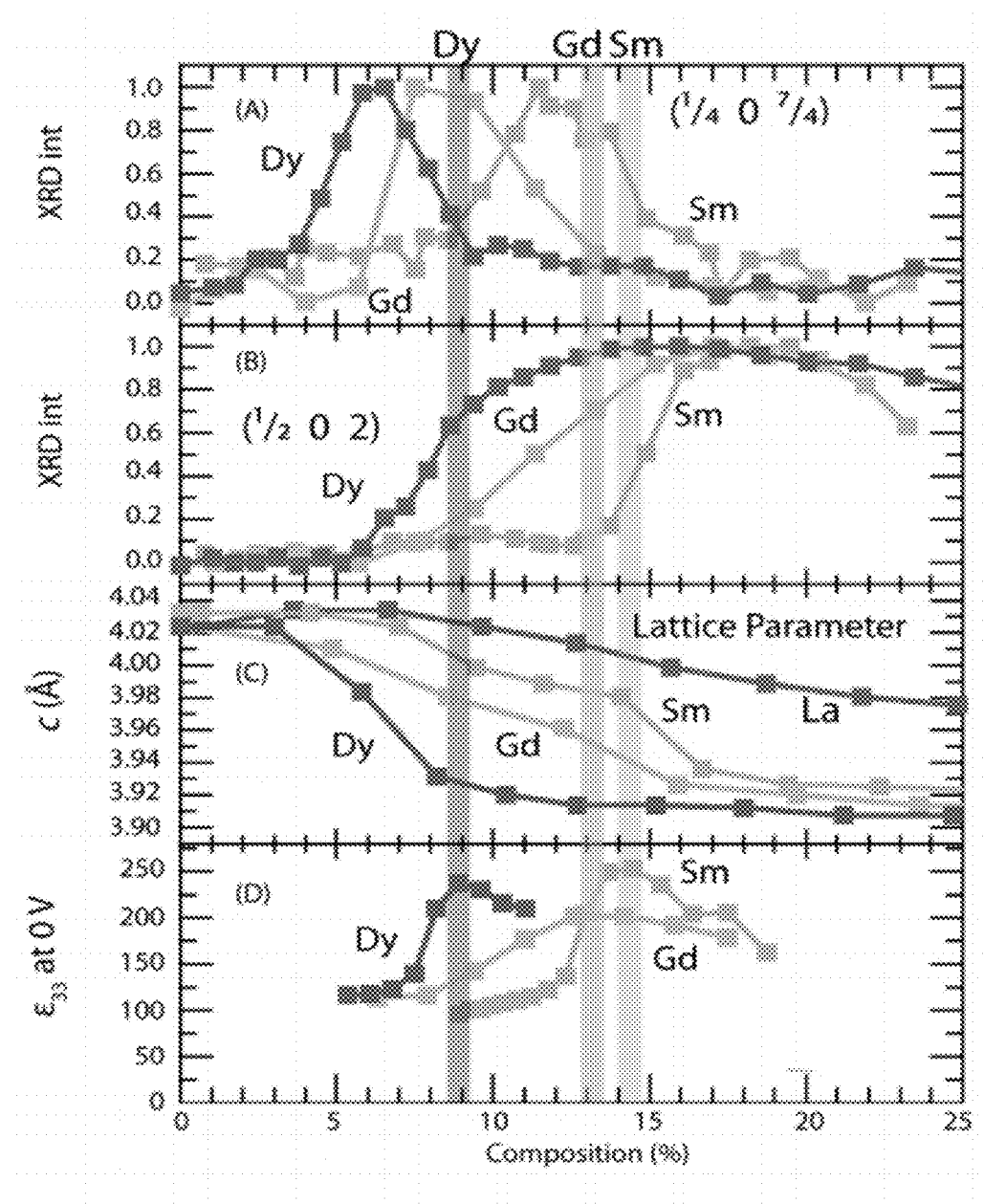

FIGS. 10A-10D show the effect of A-site doping for FE to AFE transition. FIGS. 10A and 10B show 2D X-ray diffraction results for BFSO materials doped with varying concentrations of Sm, Dy and Gd. As predicted in FIG. 2C, as the dopant's ionic radius decreases, so does the MPB. FIG. 10C shows the results of lattice parameter measurements as a function of dopant type and concentration. FIG. 10D shows the peaking of the dielectric constant in Gd and Dy doped BiFeO$_3$ at lower doping concentrations than Sm.

DETAILED DESCRIPTION OF THE INVENTION

The present invention relates to lead-free piezoelectric ceramic materials comprising crystalline (and preferably perovskite crystalline) structures of the formula Bi$_{1-x}$(RE)$_x$FeO$_3$, where RE is one or more of La, Pr, Nd, Pm, Sm, Eu, Gd, Tb, Dy, Ho, Er, Tm, Yb and Lu, and 0≦x≦0.3. The materials are at or near the morphotropic phase boundary and display enhanced piezoelectric and dielectric properties.

A. The "Lead-Free" Piezoelectric Ceramic Materials of the Present Invention

As used herein, the term "lead-free" piezoelectric ceramic material denotes a piezoelectric ceramic material that contains substantially no lead, and more preferably, is completely free of lead. As used herein, a material is said to be substantially free of lead if the amount or concentration of lead is so low as to not materially affect or alter the characteristics of the material. A material of the formula Bi1-x(RE)xFeO3, is stated to be "near" its morphotropic phase boundary if its composition is defined by an x value within 0.050 of the x value of the morphotropic phase boundary of such material, more preferably within 0.040 of the x value of the morphotropic phase boundary of such material, still more preferably within 0.030 of the x value of the morphotropic phase boundary of such material, still more preferably within 0.020 of the x value of the morphotropic phase boundary of such material, and still more preferably within 0.010 of the x value of the morphotropic phase boundary of such material. A material of the formula Bi1-x(RE)xFeO3, is stated to be "at" its morphotropic phase boundary if its composition is defined by an x value within 0.005 of the x value of the morphotropic phase boundary of such material, more preferably within 0.004 of the x value of the morphotropic phase boundary of such material, still more preferably within 0.003 of the x value of the morphotropic phase boundary of such material, still more preferably within 0.002 of the x value of the morphotropic phase boundary of such material, still more preferably within 0.001 of the x value of the morphotropic phase boundary of such material, or most preferably equal to the x value of the morphotropic phase boundary of such material.

Proximity to the morphotropic phase boundary of a material greatly enhances the piezoresponse of the material. Thus, material of the formula Bi1-x(RE)xFeO3 having a composition in which x is not at the morphotropic phase boundary of such material will have significantly different properties from a composition in which x is at the morphotropic phase boundary. Even slight departures from the morphotropic phase boundary of such material can result in markedly different properties. FIG. 6B illustrates this effect by contrasting the properties of Bi$_{0.86}$Sm$_{0.14}$FeO$_3$ to Bi$_{0.88}$Sm$_{0.12}$FeO$_3$ (see, e.g., Yuan et al. (2006) "*Multiferroicity In Polarized Single-Phase Bi$_{0.875}$Sm$_{0.125}$FeO$_3$ Ceramics*," J. Appl. Phys. 100:024109-1 to 024109-5 discussing Bi$_{0.875}$Sm$_{0.125}$FeO$_3$). As shown in FIG. 6C, Bi$_{0.86}$Sm$_{0.14}$FeO$_3$ exhibits a substantially greater piezoresponse than Bi$_{0.875}$Sm$_{0.125}$FeO$_3$.

As discussed above, ferroelectric materials are characterized by their polar structures. When exposed to an electric field, ions in these materials undergo asymmetric displacement and the result is a small change in the crystal shape, proportional to the applied field (PRINCIPLES AND APPLICATIONS OF FERROELECTRICS AND RELATED MATERIALS, Lines, M. E. et al. (1979) Oxford University Press, Oxford). This electric field induced strain, or piezoelectricity, has prevsiously been shown to be very small in lead-free piezoceramics, thus limiting their applications (Park et al. (1997) "*Ultrahigh Strain And Piezoelectric Behavior In Relaxor Based Ferroelectric Single Crystals*," J. Appl. Phys. 82:1804-1811). Recently, a large, recoverable strain value was demonstrated in BaTiO$_3$ crystals and attributed to an unusual reversible domain-switching behavior of non-180° domains upon the removal of the applied electric field (Ren (2004) "*Large Electric-Field-Induced Strain In Ferroelectric Crystals By Point-Defect-Mediated Reversible Domain Switching*," Nature Materials 3:91-94). Zhang et al. ((2007) demonstrated a large electric-field induced strain in lead-free piezoceramic materials, attributable to a phase transition from an antiferroelectric to a ferroelectric state (Zhang et al. ((2007) "*Giant Strain in Lead-Free Piezoceramics Bi$_{0.5}$Na$_{0.5}$TiO$_3$-BaTiO$_3$-K$_{0.5}$Na$_{0.5}$NbO$_3$ System*," Appl. Phys. Lett. 91:112906-1 to 112906-3).

BiFeO$_3$ (Bismuth Ferric Oxide or "BFO") is known to display rich and intricate multiferroic and chemical properties (Wang, J. et al. (2003) "*Epitaxial BiFeO$_3$ Multiferroic*

Thin Film Heterostructures," Science 299:1719-1722; Ramesh, R. et al. (2007) "Multiferroics: Progress And Prospects In Thin Films," Nature Materials 6:21-29). The present invention derives, in part, from the recognition that BFO possesses ferroelectric properties similar to those of $PbTiO_3$, and thus, has potential for development in applications where robust piezoelectricity is desired.

A dopant is a species which is intentionally introduced into an intrinsic material in order to produce some effect. Doping of piezoceramic materials can lead to improved piezoelectric performance (Chiang et al. (1998) "Lead-Free High Strain Single Crystal Piezoelectrics in the Alkaline-Bismuth-Titanate Perovskite Family," Appl. Phys. Lett. 73:3683-3685; Yu et al. (2003) "Electrical Properties and Electric Field-Induced Antiferroelectric-Ferroelectric Phase Transition in $Nd^{3+}$-Doped Lead Strontium Zirconate Titanate Ceramics," J. Appl. Phys. 94:7250-7255; Cheng et al. (2008) "Ferroelectric Properties of $Bi_{3.4}Dy_{0.6}Ti_3O_{12}$ Thin Films Crystallized in N2," Materials Lett. 62:2450-2453). This improved performance is postulated to arise from the disruption by the dopant of the long-range ferroelectric order and the formation and stabilization of the antiferroelectric order (Yu et al. (2003) "Electrical Properties and Electric Field-Induced Antiferroelectric-Ferroelectric Phase Transition in $Nd^{3+}$-Doped Lead Strontium Zirconate Titanate Ceramics," J. Appl. Phys. 94:7250-7255). It has been found that donor dopants generally decrease the pyroelectric critical grain size and the ferroelectric critical grain size of perovskite materials. Generally, an element or ion is a donor dopant if (1) it replaces an atom in the crystal lattice and has a greater number of valence electrons than the atom it replaces or (2) it exists interstitially and its outer electron shell is less than half full. Intermediate cases are uncertain and may be determined empirically. For example, some elements behave as donor dopants in (1) when their valence is the same as the atom replaced. Likewise, in (2) some elements behave as donor dopants when their valence shell is exactly half full.

Given the need for environmentally friendly lead-free piezoelectrics (Saito, Y. et al. (2004) "Lead-Free Piezoceramics," Nature 432:84-87) doped BFO is being investigated for improved properties (Uchida, H. et al. (2006) "Crystal Structure And Ferroelectric Properties Of Rare-Earth Substituted $BiFeO_3$ Thin Films," J. Appl. Phys. 100:014106-1 to 014106-9; Yuan et al. (2006) "Multiferroicity In Polarized Single-Phase $Bi_{0.875}Sm_{0.125}FeO_3$ Ceramics," J. Appl. Phys. 100:024109-1 to 024109-5; Yuan et al. (2006) "Structural Transformation And Ferroelectromagnetic Behavior In Single-Phase $Bi_{1-x}Nd_xFeO_3$ Multiferroic Ceramics," Appl. Phys. Lett. 89:052905-1 to 052905-5) so that they may emulate the performance of Pb-based piezoelectrics (Park, S. E. et al. (1997) "Ultrahigh Strain And Piezoelectric Behavior In Relaxor Based Ferroelectric Single Crystals," J. Appl. Phys. 82:1804-1811; Guo, R. et al. (2000) "Origin Of The High Piezoelectric Response In $PbZr_{1-x}Ti_xO_3$," Phys. Rev. Lett. 84:5423-5426) at morphotropic phase boundaries.

However, neither an increase in electromechanical constants as a function of dopant concentration or domain structures indicative of an MPB has been reported to date in BFO-based lead-free systems. There are some guidelines which predict the presence of MPBs (Cox et al. (2001) "Universal Phase Diagram For High-Piezoelectric Perovskite Systems," Appl. Phys. Lett. 79:400-402; Suchomel, M. R. et al. (2004) "Predicting The Position Of The Morphotropic Phase Boundary In High Temperature $PbTiO_3$-$Bi(B'B'')O_3$-Based Dielectric Ceramics," J. Appl. Phys. 96:4405-4410; Grinberg, I. et al. (2005) "Predicting Morphotropic Phase Boundary Locations And Transition Temperatures In Pb- And Bi-Based Perovskite Solid Solutions From Crystal Chemical Data And First Principles Calculations," J. Appl. Phys. 98:094111-1 to 094111-10), and one can explore novel compositions by systematically searching for similar structural transitions. The present invention derives, in part, from the recognition that the application of a combinatorial strategy (Fukumura, T. et al. (2000) "Rapid Construction Of A Phase Diagram Of Doped Mott Insulators With A Composition-Spread Approach," Appl. Phys. Lett. 77:3426-3428) in the form of composition spreads can be used to identify novel desired piezoelectric materials.

In order to find potential lead-free piezoceramic compositions using traditional one-by-one screening methods, it would be necessary to make 900 sputter-deposited amorphous films of target materials, which is very expensive and time-consuming. The present invention derives, in part from the recognition that the complexity of the screening can be substantially reduced by using considerations of known facts about the material system to identify potentially relevant candidate compositions. Ceramics that exhibit an MPB at a temperature appropriate for the desired applications of the material are said to provide a robust piezoelectric response. Ideally, useful materials will have MPBs at high transition temperatures.

To accomplish this objective, a combinatorial strategy is preferably implemented in which large compositional landscapes are rapidly screened to identify MFB structural transitions (Fukumura, T. et al. (2000) "Rapid Construction Of A Phase Diagram Of Doped Mott Insulators With A Composition-Spread Approach," Appl. Phys. Lett. 77:3426-3428; Murakami, M. et al. (2005) "Tunable Multiferroic Properties In Nanocomposite $PbTiO_3$-$CoFe_2O_4$ Epitaxial Thin Films," Appl. Phys. Lett. 87:112901-1 to 112901-3).

Most preferably, the strategy will employ the thin composition films described in U.S. Pat. No. 7,309,644. Such composition spreads allow one to track the changes in crystal structures and ferroelectric properties as a precisely controlled continuous function of composition in single crystalline like thin film forms. Most preferably, the employed strategy will screen compounds to find those that exhibit a rhombohedral to pseudo-orthorhombic structural transition which exhibits a ferroelectric (FE) to antiferroelectric (AFE) transition at approximately $Bi_{0.875}Sm_{0.125}FeO_3$ with properties comparable to PZT at MPB (Jaff, B. (1961) "Antiferroelectric Ceramics With Field Enforced Transitions; A New Nonlinear Circuit Element," Proc. Inst. Radio Engin. 49:1264-1267).

Application of such a screen has led to the identification of the preferred piezoelectric ceramics of the present invention. Such ceramics have the general formula: $Bi_{1-x}RE_xFeO_3$, where Bi is bismuth, Fe is iron, O is oxygen, RE is one or more of: La, Pr, Nd, Pm, Sm, Eu, Gd, Tb, Dy, Ho, Er, Tm, Yb and Lu, and wherein: $0.125 \leq x \leq 0.3$ for La, Pr, Nd, or Pm; $0.125 < x \leq 0.3$ for Sm; and $0 < x \leq 0.3$ for Eu, Gd, Tb, Dy, Ho, Er, Tm, Yb or Lu. Such ceramics are collectively referred to herein as "BRFO" ceramics, or as a "BLaFO," "BPrFO," "BNFO," "BPmFO," "BSFO," "BEuFO," "BGFO," "BTbFO," "BDFO," "BHFO," "BErFO," "BTmFO," BYFO," or "BLuFO," ceramic, depending upon whether the included rare earth element is completely or predominantly La, Pr, Nd, Pm, Sm, Eu, Gd, Tb, Dy, Ho, Er, Tm, Yb or Lu, respectively. BSFO and BLaFO ceramics are particularly preferred.

In a preferred embodiment, such lead-free piezoelectric ceramics of the present invention thus have the formula $Bi_{1-x}La_xFeO_3$, wherein $0.125 \leq x \leq 0.3$ (for example, $Bi_{0.875}La_{0.125}FeO_3$, $Bi_{0.87}La_{0.13}FeO_3$, $Bi_{0.86}La_{0.14}FeO_3$, $Bi_{0.85}La_{0.15}FeO_3$, $Bi_{0.84}La_{0.16}FeO_3$, $Bi_{0.83}La_{0.17}FeO_3$, $Bi_{0.82}La_{0.18}FeO_3$, $Bi_{0.81}La_{0.19}FeO_3$, $Bi_{0.80}La_{0.20}FeO_3$, $Bi_{0.79}La_{0.21}FeO_3$, $Bi_{0.78}La_{0.22}FeO_3$, $Bi_{0.77}La_{0.23}FeO_3$, $Bi_{0.76}La_{0.24}FeO_3$, $Bi_{0.75}La_{0.25}FeO_3$, $Bi_{0.74}La_{0.26}FeO_3$, $Bi_{0.73}La_{0.27}FeO_3$, $Bi_{0.72}La_{0.28}FeO_3$, $Bi_{0.71}La_{0.29}FeO_3$ or $Bi_{0.70}La_{0.30}FeO_3$).

In a further preferred embodiment, such lead-free piezoelectric ceramics of the present invention thus have the formula $Bi_{1-x}Pr_xFeO_3$, wherein $0 \leq x \leq 0.3$ (for example, $Bi_{0.875}Pr_{0.125}FeO_3$, $Bi_{0.87}Pr_{0.13}FeO_3$, $Bi_{0.86}Pr_{0.14}FeO_3$, $Bi_{0.85}Pr_{0.15}FeO_3$, $Bi_{0.84}Pr_{0.16}FeO_3$, $Bi_{0.83}Pr_{0.17}FeO_3$, $Bi_{0.82}Pr_{0.18}FeO_3$, $Bi_{0.81}Pr_{0.19}FeO_3$, $Bi_{0.80}Pr_{0.20}FeO_3$, $Bi_{0.79}Pr_{0.21}FeO_3$, $Bi_{0.78}Pr_{0.22}FeO_3$, $Bi_{0.77}Pr_{0.23}FeO_3$, $Bi_{0.76}Pr_{0.24}FeO_3$, $Bi_{0.75}Pr_{0.25}FeO_3$, $Bi_{0.74}Pr_{0.26}FeO_3$, $Bi_{0.73}Pr_{0.27}FeO_3$, $Bi_{0.72}Pr_{0.28}FeO_3$, $Bi_{0.71}Pr_{0.29}FeO_3$ or $Bi_{0.70}Pr_{0.30}FeO_3$).

In a further preferred embodiment, such lead-free piezoelectric ceramics of the present invention thus have the formula $Bi_{1-x}Nd_xFeO_3$, wherein $0 \leq x \leq 0.3$ (for example, $Bi_{0.875}Nd_{0.125}FeO_3$, $Bi_{0.87}Nd_{0.13}FeO_3$, $Bi_{0.86}Nd_{0.14}FeO_3$, $Bi_{0.85}Nd_{0.15}FeO_3$, $Bi_{0.84}Nd_{0.16}FeO_3$, $Bi_{0.83}Nd_{0.17}FeO_3$, $Bi_{0.82}Nd_{0.18}FeO_3$, $Bi_{0.81}Nd_{0.19}FeO_3$, $Bi_{0.80}Nd_{0.20}FeO_3$, $Bi_{0.79}Nd_{0.21}FeO_3$, $Bi_{0.78}Nd_{0.22}FeO_3$, $Bi_{0.77}Nd_{0.23}FeO_3$, $Bi_{0.76}Nd_{0.24}FeO_3$, $Bi_{0.75}Nd_{0.25}FeO_3$, $Bi_{0.74}Nd_{0.26}FeO_3$, $Bi_{0.73}Nd_{0.27}FeO_3$, $Bi_{0.72}Nd_{0.28}FeO_3$, $Bi_{0.71}Nd_{0.29}FeO_3$ or $Bi_{0.70}Nd_{0.30}FeO_3$).

In a further preferred embodiment, such lead-free piezoelectric ceramics of the present invention thus have the formula $Bi_{1-x}Pm_xFeO_3$, wherein $0 \leq x \leq 0.3$ (for example, $Bi_{0.875}Pm_{0.125}FeO_3$, $Bi_{0.87}Pm_{0.13}FeO_3$, $Bi_{0.86}Pm_{0.14}FeO_3$, $Bi_{0.85}Pm_{0.15}FeO_3$, $Bi_{0.84}Pm_{0.16}FeO_3$, $Bi_{0.83}Pm_{0.17}FeO_3$, $Bi_{0.82}Pm_{0.18}FeO_3$, $Bi_{0.81}Pm_{0.19}FeO_3$, $Bi_{0.80}Pm_{0.20}FeO_3$, $Bi_{0.79}Pm_{0.21}FeO_3$, $Bi_{0.78}Pm_{0.22}FeO_3$, $Bi_{0.77}Pm_{0.23}FeO_3$, $Bi_{0.76}Pm_{0.24}FeO_3$, $Bi_{0.75}Pm_{0.25}FeO_3$, $Bi_{0.74}Pm_{0.26}FeO_3$, $Bi_{0.73}Pm_{0.27}FeO_3$, $Bi_{0.72}Pm_{0.28}FeO_3$, $Bi_{0.71}Pm_{0.29}FeO_3$ or $Bi_{0.70}Pm_{0.30}FeO_3$).

In a further preferred embodiment, such lead-free piezoelectric ceramics of the present invention thus have the formula $Bi_{1-x}Sm_xFeO_3$, wherein $0.125 < x \leq 0.3$ (e.g., $Bi_{0.875}Sm_{0.125}FeO_3$, $Bi_{0.87}Sm_{0.13}FeO_3$, $Bi_{0.86}Sm_{0.14}FeO_3$, $Bi_{0.85}Sm_{0.15}FeO_3$, $Bi_{0.84}Sm_{0.16}FeO_3$, $Bi_{0.83}Sm_{0.17}FeO_3$, $Bi_{0.82}Sm_{0.18}FeO_3$, $Bi_{0.81}Sm_{0.19}FeO_3$, $Bi_{0.80}Sm_{0.20}FeO_3$, $Bi_{0.79}Sm_{0.21}FeO_3$, $Bi_{0.78}Sm_{0.22}FeO_3$, $Bi_{0.77}Sm_{0.23}FeO_3$, $Bi_{0.76}Sm_{0.24}FeO_3$, $Bi_{0.75}Sm_{0.25}FeO_3$, $Bi_{0.74}Sm_{0.26}FeO_3$, $Bi_{0.73}Sm_{0.27}FeO_3$, $Bi_{0.72}Sm_{0.28}FeO_3$, $Bi_{0.71}Sm_{0.29}FeO_3$ or $Bi_{0.70}Sm_{0.30}FeO_3$).

In a further preferred embodiment, such lead-free piezoelectric ceramics of the present invention thus have the formula $Bi_{1-x}Gd_xFeO_3$, wherein $0 < x \leq 0.3$ (for example, $Bi_{0.99}Gd_{0.01}FeO_3$, $Bi_{0.98}Gd_{0.02}FeO_3$, $Bi_{0.97}Gd_{0.03}FeO_3$, $Bi_{0.96}Gd_{0.04}FeO_3$, $Bi_{0.95}Gd_{0.05}FeO_3$, $Bi_{0.94}Gd_{0.06}FeO_3$, $Bi_{0.93}Gd_{0.07}FeO_3$, $Bi_{0.92}Gd_{0.08}FeO_3$, $Bi_{0.91}Gd_{0.09}FeO_3$, $Bi_{0.90}Gd_{0.10}FeO_3$, $Bi_{0.89}Gd_{0.11}FeO_3$, $Bi_{0.88}Gd_{0.12}FeO_3$, $Bi_{0.875}Gd_{0.125}FeO_3$, $Bi_{0.87}Gd_{0.13}FeO_3$, $Bi_{0.86}Gd_{0.14}FeO_3$, $Bi_{0.85}Gd_{0.15}FeO_3$, $Bi_{0.84}Gd_{0.16}FeO_3$, $Bi_{0.83}Gd_{0.17}FeO_3$, $Bi_{0.82}Gd_{0.18}FeO_3$, $Bi_{0.81}Gd_{0.19}FeO_3$, $Bi_{0.80}Gd_{0.20}FeO_3$, $Bi_{0.79}Gd_{0.21}FeO_3$, $Bi_{0.78}Gd_{0.22}FeO_3$, $Bi_{0.77}Gd_{0.23}FeO_3$, $Bi_{0.76}Gd_{0.24}FeO_3$, $Bi_{0.75}Gd_{0.25}FeO_3$, $Bi_{0.74}Gd_{0.26}FeO_3$, $Bi_{0.73}Gd_{0.27}FeO_3$, $Bi_{0.72}Gd_{0.28}FeO_3$, $Bi_{0.71}Gd_{0.29}FeO_3$ or $Bi_{0.70}Gd_{0.30}FeO_3$).

In a further preferred embodiment, such lead-free piezoelectric ceramics of the present invention thus have the formula $Bi_{1-x}Dy_xFeO_3$, wherein $0 < x \leq 0.3$ (for example, $Bi_{0.99}Dy_{0.01}FeO_3$, $Bi_{0.98}Dy_{0.02}FeO_3$, $Bi_{0.97}Dy_{0.03}FeO_3$, $Bi_{0.96}Dy_{0.04}FeO_3$, $Bi_{0.95}Dy_{0.05}FeO_3$, $Bi_{0.94}Dy_{0.06}FeO_3$, $Bi_{0.93}Dy_{0.07}FeO_3$, $Bi_{0.92}Dy_{0.08}FeO_3$, $Bi_{0.91}Dy_{0.09}FeO_3$, $Bi_{0.90}Dy_{0.10}FeO_3$, $Bi_{0.89}Dy_{0.11}FeO_3$, $Bi_{0.88}Dy_{0.12}FeO_3$, $Bi_{0.875}Dy_{0.125}FeO_3$, $Bi_{0.87}Dy_{0.13}FeO_3$, $Bi_{0.86}Dy_{0.14}FeO_3$, $Bi_{0.85}Dy_{0.15}FeO_3$, $Bi_{0.84}Dy_{0.16}FeO_3$, $Bi_{0.83}Dy_{0.17}FeO_3$, $Bi_{0.82}Dy_{0.18}FeO_3$, $Bi_{0.81}Dy_{0.19}FeO_3$, $Bi_{0.80}Dy_{0.20}FeO_3$, $Bi_{0.79}Dy_{0.21}FeO_3$, $Bi_{0.78}Dy_{0.22}FeO_3$, $Bi_{0.77}Dy_{0.23}FeO_3$, $Bi_{0.76}Dy_{0.24}FeO_3$, $Bi_{0.75}Dy_{0.25}FeO_3$, $Bi_{0.74}Dy_{0.26}FeO_3$, $Bi_{0.73}Dy_{0.27}FeO_3$, $Bi_{0.72}Dy_{0.28}FeO_3$, $Bi_{0.71}Dy_{0.29}FeO_3$ or $Bi_{0.70}Dy_{0.30}FeO_3$).

In a further preferred embodiment, such lead-free piezoelectric ceramics of the present invention thus have the formula $Bi_{1-x}Eu_xFeO_3$, wherein $0 < x \leq 0.3$ (for example, $Bi_{0.99}Eu_{0.01}FeO_3$, $Bi_{0.98}Eu_{0.02}FeO_3$, $Bi_{0.97}Eu_{0.03}FeO_3$, $Bi_{0.96}Eu_{0.04}FeO_3$, $Bi_{0.95}Eu_{0.05}FeO_3$, $Bi_{0.94}Eu_{0.06}FeO_3$, $Bi_{0.93}Eu_{0.07}FeO_3$, $Bi_{0.92}Eu_{0.08}FeO_3$, $Bi_{0.91}Eu_{0.09}FeO_3$, $Bi_{0.90}Eu_{0.10}FeO_3$, $Bi_{0.89}Eu_{0.11}FeO_3$, $Bi_{0.88}Eu_{0.12}FeO_3$, $Bi_{0.875}Eu_{0.125}FeO_3$, $Bi_{0.87}Eu_{0.13}FeO_3$, $Bi_{0.86}Eu_{0.14}FeO_3$, $Bi_{0.85}Eu_{0.15}FeO_3$, $Bi_{0.84}Eu_{0.16}FeO_3$, $Bi_{0.83}Eu_{0.17}FeO_3$, $Bi_{0.82}Eu_{0.18}FeO_3$, $Bi_{0.81}Eu_{0.19}FeO_3$, $Bi_{0.80}Eu_{0.20}FeO_3$, $Bi_{0.79}Eu_{0.21}FeO_3$, $Bi_{0.78}EU_{0.22}FeO_3$, $Bi_{0.77}Eu_{0.23}FeO_3$, $Bi_{0.76}Eu_{0.24}FeO_3$, $Bi_{0.75}Eu_{0.25}FeO_3$, $Bi_{0.74}Eu_{0.26}FeO_3$, $Bi_{0.73}Eu_{0.27}FeO_3$, $Bi_{0.72}Eu_{0.28}FeO_3$, $Bi_{0.71}Eu_{0.29}FeO_3$ or $Bi_{0.70}Eu_{0.30}FeO_3$).

In a further preferred embodiment, such lead-free piezoelectric ceramics of the present invention thus have the formula $Bi_{1-x}Tb_xFeO_3$, wherein $0 < x \leq 0.3$ (for example, $Bi_{0.99}Tb_{0.01}FeO_3$, $Bi_{0.98}Tb_{0.02}FeO_3$, $Bi_{0.97}Tb_{0.03}FeO_3$, $Bi_{0.96}Tb_{0.04}FeO_3$, $Bi_{0.95}Tb_{0.05}FeO_3$, $Bi_{0.94}Tb_{0.06}FeO_3$, $Bi_{0.93}Tb_{0.07}FeO_3$, $Bi_{0.92}Tb_{0.08}FeO_3$, $Bi_{0.91}Tb_{0.09}FeO_3$, $Bi_{0.90}Tb_{0.10}FeO_3$, $Bi_{0.89}Tb_{0.11}FeO_3$, $Bi_{0.88}Tb_{0.12}FeO_3$, $Bi_{0.875}Tb_{0.125}FeO_3$, $Bi_{0.87}Tb_{0.13}FeO_3$, $Bi_{0.86}Tb_{0.14}FeO_3$, $Bi_{0.85}Tb_{0.15}FeO_3$, $Bi_{0.84}Tb_{0.16}FeO_3$, $Bi_{0.83}Tb_{0.17}FeO_3$, $Bi_{0.82}Tb_{0.18}FeO_3$, $Bi_{0.81}Tb_{0.19}FeO_3$, $Bi_{0.80}Tb_{0.20}FeO_3$, $Bi_{0.79}Tb_{0.21}FeO_3$, $Bi_{0.78}Tb_{0.22}FeO_3$, $Bi_{0.77}Tb_{0.23}FeO_3$, $Bi_{0.76}Tb_{0.24}FeO_3$, $Bi_{0.75}Tb_{0.25}FeO_3$, $Bi_{0.74}Tb_{0.26}FeO_3$, $Bi_{0.73}Tb_{0.27}FeO_3$, $Bi_{0.72}Tb_{0.28}FeO_3$, $Bi_{0.71}Tb_{0.29}FeO_3$ or $Bi_{0.70}Tb_{0.30}FeO_3$).

In a further preferred embodiment, such lead-free piezoelectric ceramics of the present invention thus have the formula $Bi_{1-x}Ho_xFeO_3$, wherein $0 < x \leq 0.3$ (for example, $Bi_{0.99}Ho_{0.01}FeO_3$, $Bi_{0.98}Ho_{0.02}FeO_3$, $Bi_{0.97}Ho_{0.03}FeO_3$, $Bi_{0.96}Ho_{0.04}FeO_3$, $Bi_{0.95}Ho_{0.05}FeO_3$, $Bi_{0.94}Ho_{0.06}FeO_3$, $Bi_{0.93}Ho_{0.07}FeO_3$, $Bi_{0.92}Ho_{0.08}FeO_3$, $Bi_{0.91}Ho_{0.09}FeO_3$, $Bi_{0.90}Ho_{0.10}FeO_3$, $Bi_{0.89}Ho_{0.11}FeO_3$, $Bi_{0.88}Ho_{0.12}FeO_3$, $Bi_{0.875}Ho_{0.125}FeO_3$, $Bi_{0.87}Ho_{0.13}FeO_3$, $Bi_{0.86}Ho_{0.14}FeO_3$, $Bi_{0.85}Ho_{0.15}FeO_3$, $Bi_{0.84}Ho_{0.16}FeO_3$, $Bi_{0.83}Ho_{0.17}FeO_3$, $Bi_{0.82}Ho_{0.18}FeO_3$, $Bi_{0.81}Ho_{0.19}FeO_3$, $Bi_{0.80}Ho_{0.20}FeO_3$, $Bi_{0.79}Ho_{0.21}FeO_3$, $Bi_{0.78}Ho_{0.22}FeO_3$, $Bi_{0.77}Ho_{0.23}FeO_3$, $Bi_{0.76}Ho_{0.24}FeO_3$, $Bi_{0.75}Ho_{0.25}FeO_3Bi_{0.74}Ho_{0.26}FeO_3$, $Bi_{0.73}Ho_{0.27}FeO_3$, $Bi_{0.72}Ho_{0.28}FeO_3$, $Bi_{0.71}Ho_{0.29}FeO_3$ or $Bi_{0.70}Ho_{0.30}FeO_3$).

In a further preferred embodiment, such lead-free piezoelectric ceramics of the present invention thus have the formula $Bi_{1-x}Er_xFeO_3$, wherein $0 < x \leq 0.3$ (for example, $Bi_{0.99}Er_{0.01}FeO_3$, $Bi_{0.98}Er_{0.02}FeO_3$, $Bi_{0.97}Er_{0.03}FeO_3$, $Bi_{0.96}Er_{0.04}FeO_3$, $Bi_{0.95}Er_{0.05}FeO_3$, $Bi_{0.94}Er_{0.06}FeO_3$, $Bi_{0.93}Er_{0.07}FeO_3$, $Bi_{0.92}Er_{0.08}FeO_3$, $Bi_{0.91}Er_{0.09}FeO_3$, $Bi_{0.90}Er_{0.10}FeO_3$, $Bi_{0.89}Er_{0.11}FeO_3$, $Bi_{0.88}Er_{0.12}FeO_3$, $Bi_{0.875}Er_{0.125}FeO_3$, $Bi_{0.87}Er_{0.13}FeO_3$, $Bi_{0.86}Er_{0.14}FeO_3$, $Bi_{0.85}Er_{0.15}FeO_3$, $Bi_{0.84}Er_{0.16}FeO_3$, $Bi_{0.83}Er_{0.17}FeO_3$, $Bi_{0.82}Er_{0.18}FeO_3$, $Bi_{0.81}Er_{0.19}FeO_3$, $Bi_{0.80}Er_{0.20}FeO_3$, $Bi_{0.79}Er_{0.21}FeO_3$, $Bi_{0.78}Er_{0.22}FeO_3$, $Bi_{0.77}Er_{0.23}FeO_3$, $Bi_{0.76}Er_{0.24}FeO_3$, $Bi_{0.75}Er_{0.25}FeO_3$, $Bi_{0.74}Er_{0.26}FeO_3$, $Bi_{0.73}Er_{0.27}FeO_3$, $Bi_{0.72}Er_{0.28}FeO_3$, $Bi_{0.73}Er_{0.29}FeO_3$ or $Bi_{0.70}Er_{0.30}FeO_3$).

In a further preferred embodiment, such lead-free piezoelectric ceramics of the present invention thus have the formula $Bi_{1-x}Tm_xFeO_3$, wherein $0 < x \leq 0.3$ (for example, $Bi_{0.99}Tm_{0.01}FeO_3$, $Bi_{0.98}Tm_{0.02}FeO_3$, $Bi_{0.97}Tm_{0.03}FeO_3$, $Bi_{0.96}Tm_{0.04}FeO_3$, $Bi_{0.95}Tm_{0.05}FeO_3$, $Bi_{0.94}Tm_{0.06}FeO_3$, $Bi_{0.93}Tm_{0.07}FeO_3$, $Bi_{0.92}Tm_{0.08}FeO_3$, $Bi_{0.91}Tm_{0.09}FeO_3$, $Bi_{0.90}Tm_{0.10}FeO_3$, $Bi_{0.89}Tm_{0.11}FeO_3$, $Bi_{0.88}Tm_{0.12}FeO_3$, $Bi_{0.875}Tm_{0.125}FeO_3$, $Bi_{0.87}Tm_{0.13}FeO_3$, $Bi_{0.86}Tm_{0.14}FeO_3$, $Bi_{0.85}Tm_{0.15}FeO_3$, $Bi_{0.84}Tm_{0.16}FeO_3$, $Bi_{0.83}Tm_{0.17}FeO_3$, $Bi_{0.82}Tm_{0.18}FeO_3$, $Bi_{0.81}Tm_{0.19}FeO_3$, $Bi_{0.80}Tm_{0.20}FeO_3$, $Bi_{0.79}Tm_{0.21}FeO_3$, $Bi_{0.78}Tm_{0.22}FeO_3$, $Bi_{0.77}Tm_{0.23}FeO_3$, $Bi_{0.76}Tm_{0.24}FeO_3$, $Bi_{0.75}Tm_{0.25}FeO_3$, $Bi_{0.74}Tm_{0.26}FeO_3$, $Bi_{0.73}Tm_{0.27}FeO_3$, $Bi_{0.72}Tm_{0.28}FeO_3$, $Bi_{0.71}Tm_{0.29}FeO_3$ or $Bi_{0.70}Tm_{0.30}FeO_3$).

In a further preferred embodiment, such lead-free piezoelectric ceramics of the present invention thus have the formula $Bi_{1-x}Yb_xFeO_3$, wherein $0<x\leq0.3$ (for example, $Bi_{0.99}Yb_{0.01}FeO_3$, $Bi_{0.98}Yb_{0.02}FeO_3$, $Bi_{0.97}Yb_{0.03}FeO_3$, $Bi_{0.96}Yb_{0.04}FeO_3$, $Bi_{0.95}Yb_{0.05}FeO_3$, $Bi_{0.94}Yb_{0.06}FeO_3$, $Bi_{0.93}Yb_{0.07}FeO_3$, $Bi_{0.92}Yb_{0.08}FeO_3$, $Bi_{0.91}Yb_{0.09}FeO_3$, $Bi_{0.90}Yb_{0.10}FeO_3$, $Bi_{0.89}Yb_{0.11}FeO_3$, $Bi_{0.88}Yb_{0.12}FeO_3$, $Bi_{0.875}Yb_{0.125}FeO_3$, $Bi_{0.87}Yb_{0.13}FeO_3$, $Bi_{0.86}Yb_{0.14}FeO_3$, $Bi_{0.85}Yb_{0.15}FeO_3$, $Bi_{0.84}Yb_{0.16}FeO_3$, $Bi_{0.83}Yb_{0.17}FeO_3$, $Bi_{0.82}Yb_{0.18}FeO_3$, $Bi_{0.81}Yb_{0.19}FeO_3$, $Bi_{0.80}Yb_{0.20}FeO_3$, $Bi_{0.79}Yb_{0.21}FeO_3$, $Bi_{0.78}Yb_{0.22}FeO_3$, $Bi_{0.77}Yb_{0.23}FeO_3$, $Bi_{0.76}Yb_{0.24}FeO_3$, $Bi_{0.75}Yb_{0.25}FeO_3$, $Bi_{0.74}Yb_{0.26}FeO_3$, $Bi_{0.73}Yb_{0.27}FeO_3$, $Bi_{0.72}Yb_{0.28}FeO_3$, $Bi_{0.71}Yb_{0.29}FeO_3$ or $Bi_{0.70}Yb_{0.30}FeO_3$).

In a further preferred embodiment, such lead-free piezoelectric ceramics of the present invention thus have the formula $Bi_{1-x}Lu_xFeO_3$, wherein $0<x\leq0.3$ (for example, $Bi_{0.99}Lu_{0.01}FeO_3$, $Bi_{0.98}Lu_{0.02}FeO_3$, $Bi_{0.97}Lu_{0.03}FeO_3$, $Bi_{0.96}Lu_{0.04}FeO_3$, $Bi_{0.95}Lu_{0.05}FeO_3$, $Bi_{0.94}Lu_{0.06}FeO_3$, $Bi_{0.93}Lu_{0.07}FeO_3$, $Bi_{0.92}Lu_{0.08}FeO_3$, $Bi_{0.91}Lu_{0.09}FeO_3$, $Bi_{0.90}Lu_{0.10}FeO_3$, $Bi_{0.89}Lu_{0.11}FeO_3$, $Bi_{0.88}Lu_{0.12}FeO_3$, $Bi_{0.875}Lu_{0.125}FeO_3$, $Bi_{0.87}Lu_{0.13}FeO_3$, $Bi_{0.86}Lu_{0.14}FeO_3$, $Bi_{0.85}Lu_{0.15}FeO_3$, $Bi_{0.84}Lu_{0.16}FeO_3$, $Bi_{0.83}Lu_{0.17}FeO_3$, $Bi_{0.82}Lu_{0.18}FeO_3$, $Bi_{0.81}Lu_{0.19}FeO_3$, $Bi_{0.80}Lu_{0.20}FeO_3$, $Bi_{0.79}Lu_{0.21}FeO_3$, $Bi_{0.78}Lu_{0.22}FeO_3$, $Bi_{0.77}Lu_{0.23}FeO_3$, $Bi_{0.76}Lu_{0.24}FeO_3$, $Bi_{0.75}Lu_{0.25}FeO_3$, $Bi_{0.74}Lu_{0.26}FeO_3$, $Bi_{0.73}Lu_{0.27}FeO_3$, $Bi_{0.72}Lu_{0.28}FeO_3$, $Bi_{0.71}Lu_{0.29}FeO_3$ and $Bi_{0.70}Lu_{0.30}FeO_3$).

Although the invention particularly relates to ceramics having only one of the above-listed rare earth elements, the invention also contemplates materials having mixtures of two, three or more of such elements.

B. Uses of the "Lead-Free" Piezoelectric Ceramic Materials of the Present Invention The above-described, lead-free piezoelectric ceramic materials have multiple uses. In one embodiment such ceramics are employed in devices capable of generating a change in an electric field in response to a mechanical force. Such devices include piezoelectric sensors, piezoelectric batteries, igniters, and generators, piezoelectric microphones, specialized scientific instruments (such as atomic force microscopes, scanning probe microscopes, etc.), piezoelectric transducers, etc. In an alternate embodiment such ceramics are employed in devices capable of generating a mechanical force in response to a change in an electric field. Such devices include piezoelectric motors, piezoelectric relays; piezoelectric buzzers and alarms, piezoelectric speakers (e.g., telephone speakers, cell phone speakers, loudspeakers, television speakers, radio speakers, etc.), specialized scientific instruments (such as laser aligning devices, etc.), piezoelectric actuators, piezoelectric sensors, piezoelectric ultrasound sonic generators, piezoelectric pumps, etc.

C. Definitions of Piezoelectric Constants

As used herein, d represents the piezoelectric charge constant and denotes the polarization generated per unit of mechanical stress (T) applied to a piezoelectric material and the mechanical strain (S) experienced by a piezoelectric material per unit of electric field applied. d is represented with 2 subscripts: the first such subscript indicates the direction of polarization generated in the material when the electric field is zero (i.e., the direction of the applied field strength); the second such subscript indicates the direction of the applied stress or the induced strain. For example, a piezoelectric charge constant of $d_{33}$ indicates that the induced polarization is in direction 3 (i.e., parallel to the direction of the element's polarization) per unit stress applied in direction 3. $d_{33}$ also indicates that the induced strain is in direction 3 per unit electric field applied in direction 3. The strain induced in a piezoelectric material by an applied electric field is the product of the E field value and d, and therefore, the piezoelectric charge constant is an important indicator of a material's suitability for actuator applications.

The piezoelectric voltage constant, g is the electric field generated by a piezoelectric material per unit of mechanical stress applied to said material. Alternatively, g is the mechanical strain experienced by a piezoelectric material per unit of electric displacement applied. Like d, g also is represented with two subscripts: the first indicates the direction of the electric field generated in the material, or the direction of the applied electric displacement; the second is the direction of the applied stress or the induced strain. The strength of the induced electric field produced by a piezoelectric material in response to an applied physical stress is equal to the product of the value for the applied stress and the value of g; therefore, g is important for assessing a material's suitability for sensing applications.

The permittivity or dielectric constant ($\epsilon$) for a piezoelectric ceramic material is the dielectric displacement per unit electric field. $\epsilon T$ is the permittivity at constant stress; $\epsilon S$ is the permittivity at constant strain. Similar to d and g, $\epsilon$ also has two subscripts: the first indicates the direction of the dielectric displacement; the second is the direction of the electric field. The relative dielectric constant (K) is the ratio of $\epsilon$ (amount of charge that a ceramic element can store), relative to $\epsilon_0$ (the charge that can be stored by the same electrodes when separated by a vacuum at equal voltage; $\epsilon_0 = 8.85 \times 10^{-12}$ farad/meter).

The elastic compliance (s) is the strain produced in a piezoelectric material per unit of stress applied, and for the 11 and 33 directions, is the reciprocal of the modulus of elasticity (Young's modulus, Y; indicator of the stiffness of a material). sD is the compliance under a constant electric displacement; sE is the compliance under a constant electric field. s is also represented with two subscripts: the first indicates the direction of the strain; the second is the direction of the stress.

The electromechanical coupling factor (k) is an indicator of the effectiveness with which a piezoelectric material converts electrical energy into mechanical energy, or vice versa. k is represented with two subscripts: the first such subscript denotes the direction along which the electrodes are applied; the second denotes the direction along which the mechanical energy is applied. A high k value is usually desirable for efficient energy conversion; however, k does not account for dielectric or mechanical losses, nor for recovery of unconverted energy. Therefore, the accurate measure of efficiency is the ratio of converted, useable energy delivered by the piezoelectric element relative to the total energy taken up by the element. In well designed systems, piezoelectric ceramic elements can exhibit efficiencies of greater than 90%.

The performance of piezoelectric actuators and sensors is dependent on the microstructural properties of the piezoelectric materials. Commercially available piezoelectric materials, including PZT, PLZT, and PMN-PT, typically exhibit good piezoelectric response but poor fatigue life. Attempts have been made in the past to improve the microstructure of piezoelectric materials using fine-grained precursors with conventional sintering techniques. Although such attempts at microstructural improvement have enhanced some piezoelectric performance characteristics, fatigue life remains low because conventionally sintered ceramics typically have densities of only 90-95% of their theoretical values. U.S. Pat. Nos. 5,595,677 and 5,607,632 present new piezoelectric materials with improved grain orientation, greater density, and extended fatigue life and a process for forming these piezoelectric materials. Those new materials comprise a family of Nb-doped PLZT piezoelectric ceramics.

Having now generally described the invention, the same will be more readily understood through reference to the following examples, which are provided by way of illustration and are not intended to be limiting of the present invention unless specified.

EXAMPLE 1

Methods of Combinatorial Synthesis and Screening of $Bi_{1-x}(RE)_xFeO_3$ Compositions The fabrication and application of thin films with continuously graded or discrete physical property parameters to functionally broadband monolithic microelectronic optoelectronic/sensor/actuator device arrays is accomplished essentially as described in U.S. Pat. No. 7,309,644. In brief, a single continuous composition spread thin film is deposited on a substrate with continuously varying material components by: 1) defining fabrication parameters, i.e. entering specific data regarding the specifications for fabrication of the thin films with continuously graded physical property parameters (in this case, various concentrations of dopants); 2) calibrating the source based on the amount of the particular material to be deposited during a specific amount of time in order to form a layer of desired thickness; 3) aligning the aperture of the mask or shutter over the desired area of the substrate; 4) calculating the deposition period for each layer; and 5) depositing the material onto the substrate for the calculated deposition time.

Thin film composition spreads of $Bi_{1-x}Sm_xFeO_3$ ($0 \leq x \leq 1$) are deposited with varying concentrations of Sm with an average film thickness of 200 nm, allowing for simultaneous tracking of changes in crystal structure and ferroelectric properties as a precisely controlled continuous function of composition in single crystalline like thin film forms. A pulsed laser deposition technique for fabricating epitaxial composition spread films on $SrTiO_3$ substrates is used (Fukumura et al. (2000) "*Rapid Construction Of A Phase Diagram Of Doped Mott Insulators With A Composition-Spread Approach,*" Applied Physics Letters 77:3426-3428).

The linear motion of the two masks and the switching of the targets are synchronized with a period of one unit cell perovskite deposition. Concurrent X-ray diffraction measurements are taken to monitor thin film growth. A line-shaped and convergent X-ray is impinged on the film. The diffracted X-ray is detected by an imaging plate. Next, piezoresponse force microscopy scans are taken of the thin films to determine piezoresponse as a function of composition. Structural changes to samples are measured using two-dimensional X-ray diffraction and high-resolution cross-sectional transmission electron microscopy methods.

Thin Film Characterization Methods

Concurrent X-ray Diffraction. As discussed above, concurrent X-ray diffraction measurements are taken to track film growth during deposition. Concurrent X-ray diffraction allows for simultaneous measurement of the X-ray diffraction spectra of the entire composition. To accomplish this, an X-ray from a point source on a rotating cathode is focused on the film as a line shaped region of $10 \times 0.1$ mm$^2$ with a convergence angle of 2° using a curved monochromator. The diffracted x ray is recorded on an imaging plate. The two axes in the detector are the Bragg angle 2θ (~4°) and the position (~10 mm) on the film, which directly correspond to the composition. In this way, initial screens are performed which reveal structural transitions at potentially important concentrations across the thin film.

Piezoresponse force microscopy (PFM). Piezoresponse force microscopy (PFM) is a scanning probe microscopy technique based on the reverse piezoelectric effect, in which a material expands or contracts in response to the application of an electric field (see, Kalinin S. V. et al. (2006) "*A Decade Of Piezoresponse Force Microscopy: Progress, Challenges, And Opportunities,*" IEEE Trans. Ultrason. Ferroelectr. Freq. Control. 53(12):2226-2252). PFM is a derivative of atomic force microscopy, known as "contact mode" atomic force microscopy. In PFM, a sample's mechanical response to an applied electric field is measured, using an atomic force microscopy (AFM) tip that is made of, or coated with, a conductive material in order to enhance electrical contact between the tip and the sample. An AC modulation with an optional DC offset bias is applied to the tip, which is in contact with the sample surface, and the piezoresponse of the sample is measured from the deflection of the AFM cantilever.

PFM enables measurements and characterization of piezoelectric behavior of materials on the nanometer and sub-nanometer scale. It is able to measure the electromechanical response of a material on the level of individual nanometer-scale grains. In fact, PFM has been shown to delineate regions with different piezoresponses with sub-nanometer scale resolution (Kalinin, S. V. et al. (2005) "*Electromechanical Imaging of Biological Systems With Sub-10 nm Resolution,*" Appl. Phys. Lett. 87:053901-1-053901). Since thin films of ferroelectric materials are grown on metal substrates, it is extremely useful to determine at what point during the growth of the thin film is ferroelectricity present. In the context of the present invention, PFM is useful for determining at what point the ferroelectric/antiferroelectric transition occurs. If a piezoelectric response for a given nanometer scale domain is present, then this implies ferroelectricity; likewise, if there is no piezoresponse, no ferroelectricity is presumed to exist in that domain. (FERROELECTRIC THIN FILMS, BASIC PROPERTIES AND DEVICE PHYSICS FOR MEMORY APPLICATIONS, (2005) Okuyama et al., eds., Topics in Applied Physics Series, Springer-Verlag Publishing Company, Germany; Sections 3 and 5.2)

2D X-ray Diffraction. A 2D X-ray diffraction system is capable of acquiring diffraction patterns from a sample in 2D space simultaneously, while analyzing the 2D diffraction data accordingly. A 2D X-ray diffraction system consists of at least one 2D detector, an X-ray source, X-ray optics, a sample positioning stage, a sample alignment and monitoring device, and a corresponding computer with control and data reduction and analysis software. The 2D diffraction pattern obtained using this system contains far more information than a 1D profile collected with a conventional diffractometer. Compared to a conventional 1D diffraction system, a 2D diffraction system has advantages in applications such as phase identification, which is accomplished by integration over a selected range of 2θ and γ, and gives better intensity and phase ID statistics for samples with texture, large grain size or small quantity (Sulyanov, S. N. et al. (1994) "*Using a Two-Dimensional Detector for X-ray Powder Diffractometry,*" J. Appl. Cryst. 27:934-942); rapid texture measurement for multiple poles and multiple directions, allowing for measurements of sharp textures (Smith et al. (1993) "*Use of a Two-Dimensional, Position Sensitive Detector for Collecting Pole Figures,*" Adv. X-ray Anal. 36:641-647); high sensitivity, high speed, high accuracy measurements of stress in a sample, allowing for measurements of samples with texture or large grain sizes (Baoping, B. et al. (1998) "*Fundamental Equation of Strain and Stress Measurement Using 2D Detectors,*" Proc. SEM Conf. Exp. Appl. Mech.); high speed small angle X-ray scattering data collection using one exposure to collect desired information, allowing for fine details of anisotropic features of samples (INTRODUCTION TO X-RAY POWDER DIFFRACTOMETRY, Jenkins and Snyder, (1996) John Wiley & Sons, New York); and thin film sample measurements, when the thin films are a mixture of single crystal, random polycrystalline and highly crystallized layers.

EXAMPLE 2

Characterization of Ferroelectric/Piezoelectric Properties of $Bi_{1-x}(Sm)_xFeO_3$ Compositions A series of pseudobinary composition spread epitaxial thin-film libraries (200 nm thick) are fabricated on $SrTiO_3$ (STO (100)) substrates 6 mm long by the combinatorial pulsed laser deposition system (Pascal, Inc.) at 600° C., where a pseudobinary compositional phase diagram of $Bi_{1-x}(RE)_xFeO_3$ or $BiFe_{1-y}(TM)_yO_3$ is continuously mapped on each chip. RE and TM denote rare earth and transition metal cations, respectively. Composition variation across the spreads are confirmed by an electron probe (JEOL JXA-8900), and the uncertainty in the composition at each point on the spread is +/−1.5%. Scanning X-ray micro-diffraction (Bruker D8 Discover) is performed with a 0.5 mm diameter aperture. For electrical characterization, an epitaxial $SrRuO_3$ (SRO) layer (50 nm) is used as the bottom electrode, and a sputter-deposited to Pd layer (50 nm) is patterned into 50 μm capacitor dots. Ferroelectric polarization hysteresis loops are obtained using the Radiant Precision LC at 5 kHz. Quantitative piezoresponse force microscopy is used to measure the out-of-plane piezoresponse.

Figure 1:
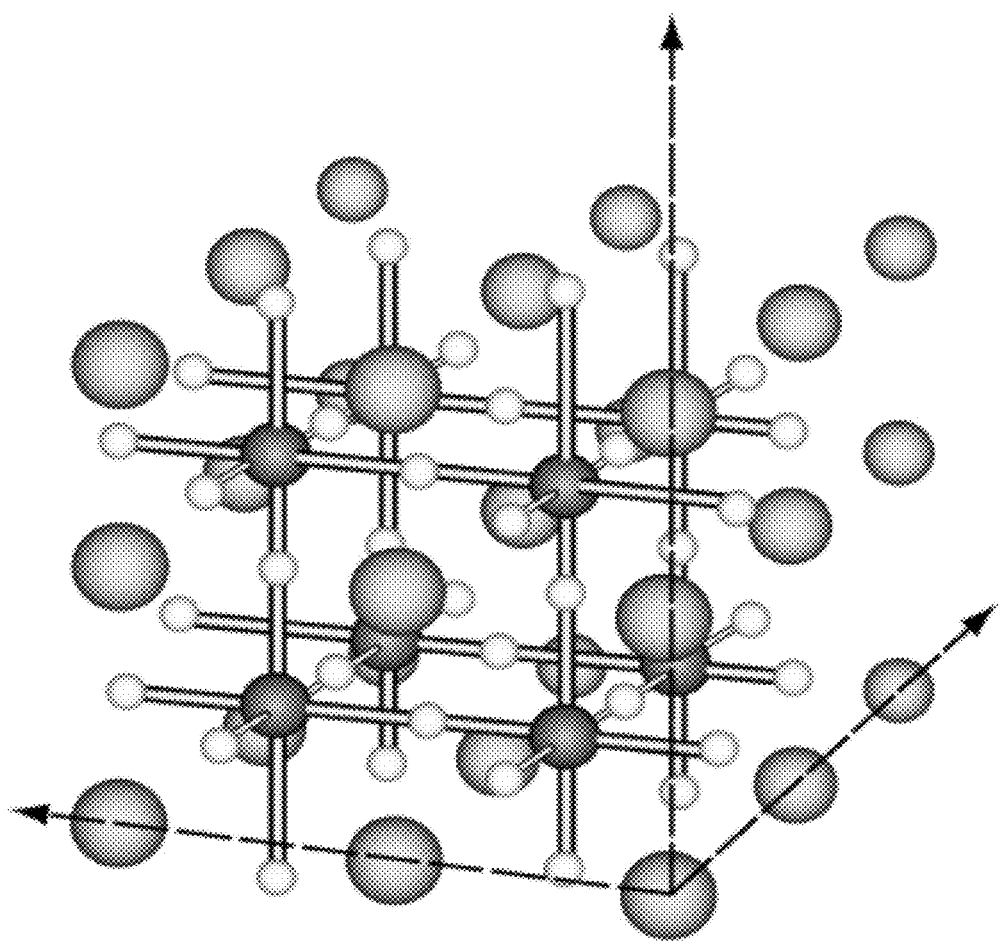
FIG. 1 is a schematic of the structure of a perovskite-type crystalline lattice. A perovskite comprises the structure $ABO_3$, where A and B each represent cations and O represents oxygen. A and B differ in that A has a larger ionic radius than B and is in twelve-fold coordination, whereas B is in an octahedral six-fold coordination.
Figure 2A:
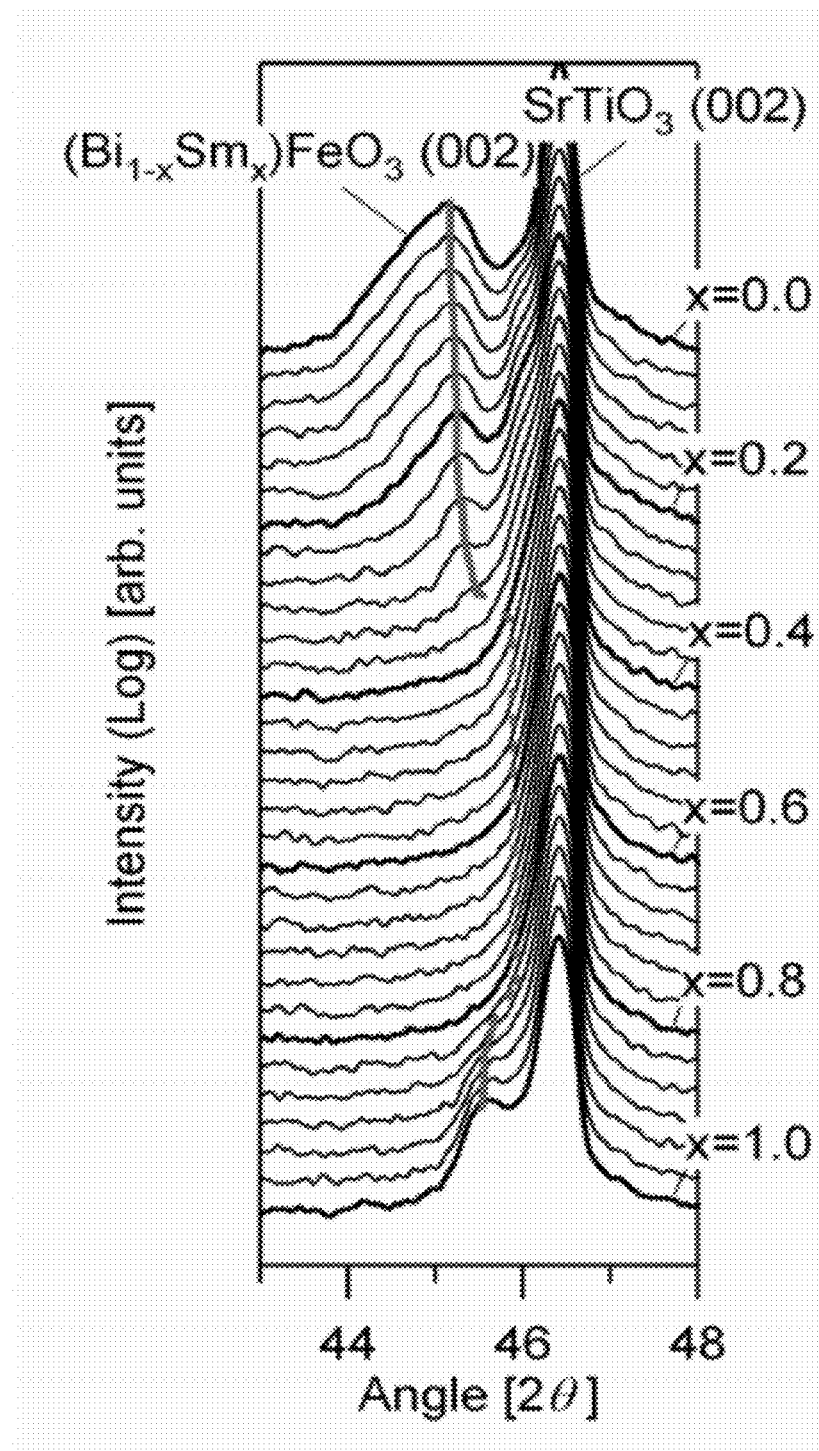
FIGS. 2A-2C show X-ray diffraction and structural phase diagrams of $Bi_{1-x}Sm_xFeO_3$.
Figure 2B:
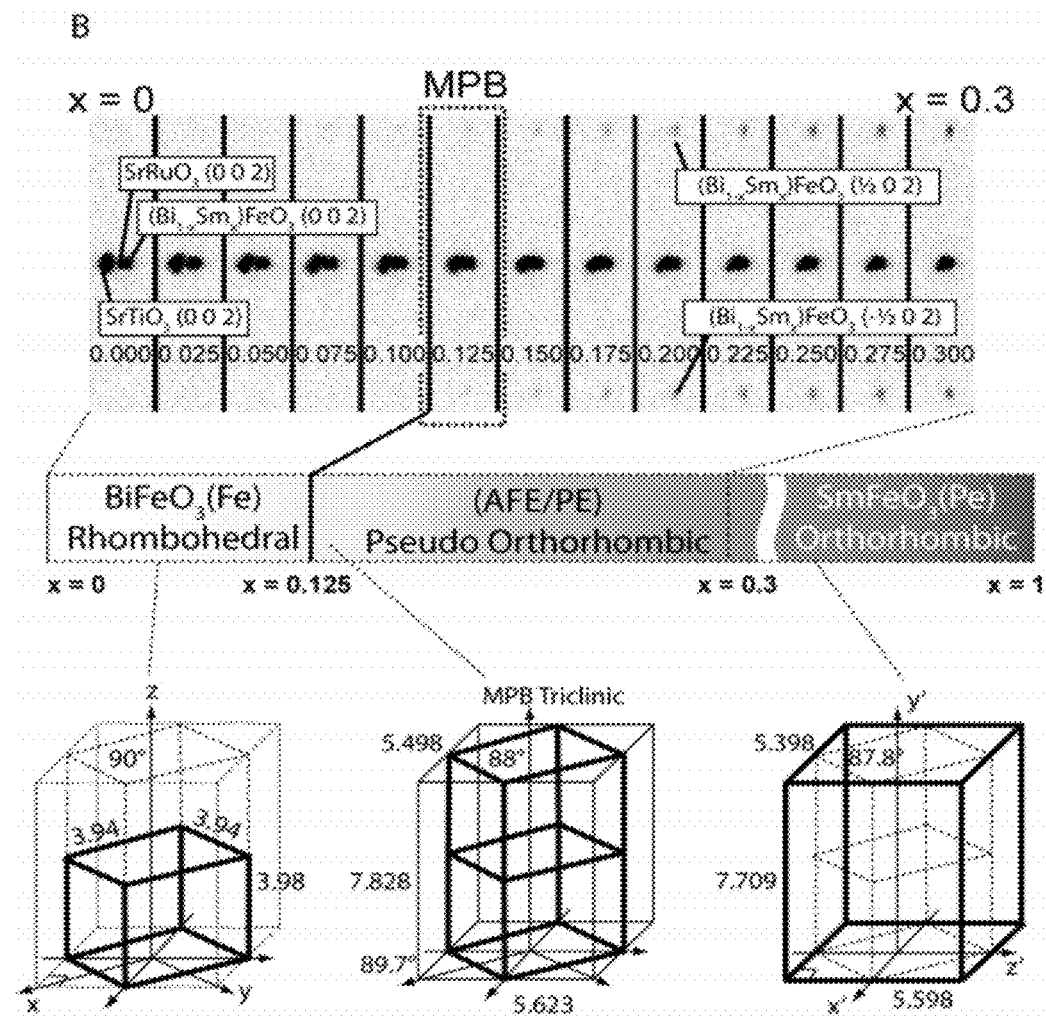

X-ray diffraction (XRD) of a BSFO composition spread on $SrTiO_3$ showed that the entire composition range had grown epitaxially on the substrate (FIG. 2A). Initial piezoresponse force microscopy scan (Jin, Y. M. et al. (2003) "*Adaptive Ferroelectric States in Systems with Low Domain-Wall Energy: Tetragonal Microdomains,*" J. Appl. Phys. 94:3629-3640) of a BSFO spread library indicated significant enhancement of piezoresponse at compositions near $Bi_{0.8-0.85}Sm_{0.2-0.15}FeO_3$, where the structure is seen to undergo substantial change in the out-of-plane lattice constant (FIG. 2B). A detailed 2D X-ray diffraction analysis of this region revealed appearance of extra diffraction spots starting at $x \geq 0.13$ (FIG. 2B) indicating a structural change to a lower symmetry phase. High temperature diffraction on the spreads showed that a triclinic phase starts at the same composition of $x \approx 0.14$ up to the highest measured temperature of 400° C., confirming the vertical nature of the phase boundary and therefore the wide temperature range over which the composition is useful. The vertical phase boundary (in temperature) is reported to be critical for the presence of a low symmetry phase. (Woodward, D. et al. (2005) "*Review Of Crystal And Domain Structures In The $PbZr_xTi_{1-x}O_3$ Solid Solution,*" Phys. Rev. B. 72:104110-1 to 104110-8; Guo, R. et al. (2000) "*Origin Of The High Piezoelectric Response In $PbZr_{1-x}Ti_xO_3$,*" Phys. Rev. Lett. 84:5423-5426; Vanderbilt, D. et al. (2001) "*Monoclinic And Triclinic Phases In Higher Order Devonshire Theory,*" Phys. Rev. B. 63:094108-1 to 094108-9; Noheda, B. et al. (2000) "*Stability Of The Monoclinic Phase In The Ferroelectric Perovskite $PbZr_{1-x}Ti_xO_3$,*" Phys. Rev. B. 63:014103-1 to 014103-1 to 014103-9; Cox et al. (2001) "*Universal Phase Diagram For High-Piezoelectric Perovskite Systems,*" Appl. Phys. Lett. 79:400-402)

Figure 3:
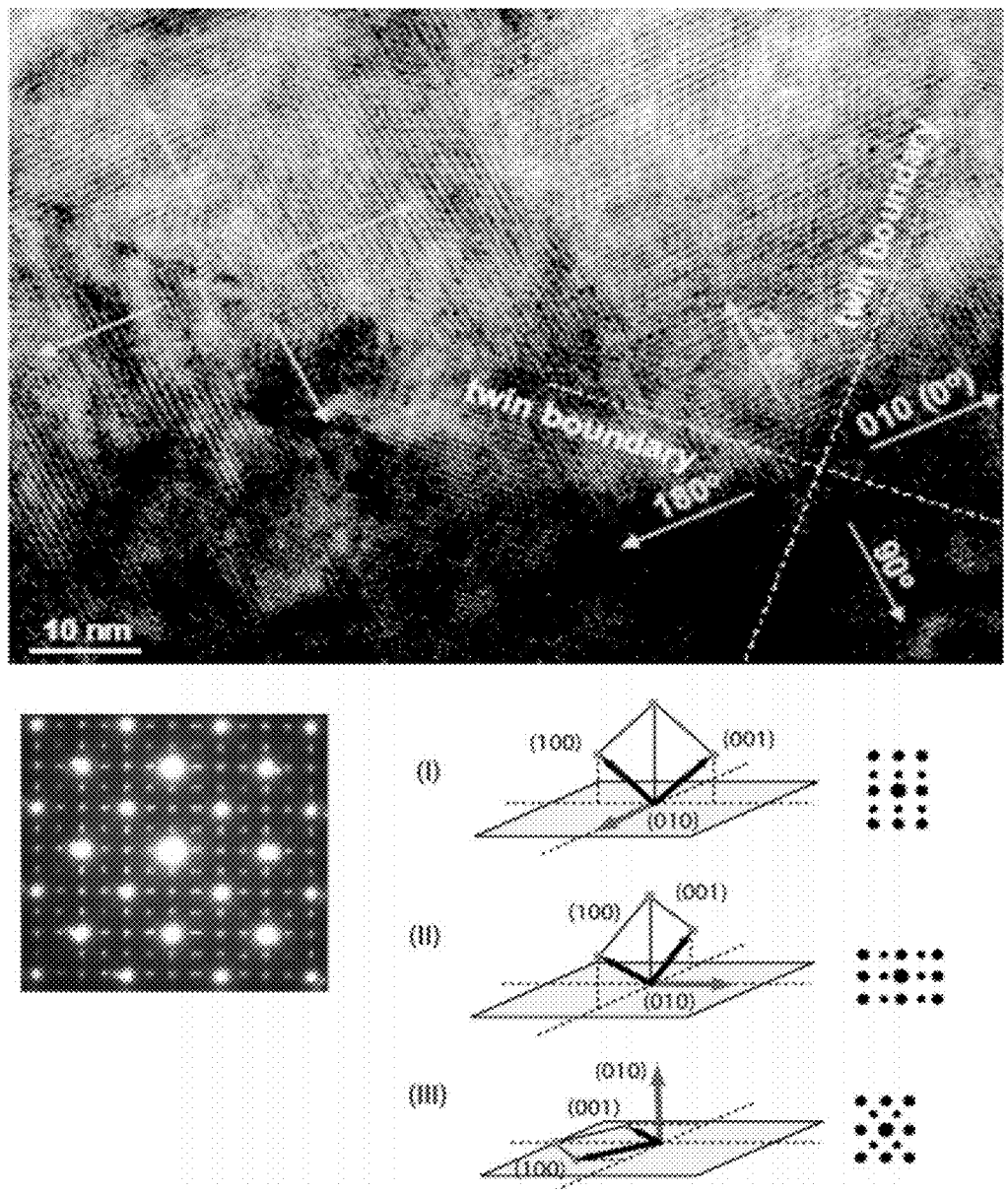
FIG. 3 shows a high resolution cross sectional transmission electron microscopy image (left) of the composition at the MPB of x≈0.14. The triclinic nanodomains (20-50 nm in size) are observed with twin boundaries. The arrows denote the (010) direction of the domains. The b-axis is 7.828 Å. The selected area electron diffraction of this region (bottom, left) is consistent with superposition of diffractions from nanodomains in 3 different orientations: I, II and III of the triclinic structure (bottom right).

High resolution cross-sectional transmission electron microscopy (TEM) of an individual composition sample at $x \approx 0.14$ (FIG. 3) reveals presence of unusual nanoscale triclinic domains 20-50 nm in size displaying three different epitaxial orientations. The lattice parameters are a=5.62 Å, b=7.83 Å, c=5.50 Å, a=γ=89.8°, and β=89.7°. There are twin-boundaries at the interfaces where domains are 90, 180 and 270 degrees rotated from each other. In addition, some boundaries are decorated with ≈5 nm wide narrow strips of $\alpha$-$Fe_2O_3$ (not shown). Previously, occurrence of local deficiency of Bi and concomitant formation of $\alpha$-$Fe_2O_3$ was identified as a stress accommodating mechanism in BFO growth. The occurrence of stress accommodation and formation of twin boundaries with such nanoscale size implies that they are low domain wall energy boundaries. These characteristics have previously been identified as fingerprints of an adaptive ferroelectric phase at the MPB with high piezoelectric coefficient and narrow hysteresis loops. (Jin, Y. M. et al. (2003) "*Conformal Miniaturization Of Domains With Low Domain-Wall Energy: Monoclinic Ferroelectric States Near The Morphotropic Phase Boundaries,*" Phys. Rev. Lett. 91:197601-1 to 197601-4; Jin, Y. M. et al. (2003) "*Adaptive Ferroelectric States In Systems With Low Domain Wall Energy: Tetragonal Microdomains,*" J. Appl. Physics 94:3629-3640) On both sides of x=0.125, away from the MPB region, the grains are found to be much larger in size (~500 nm).

Figure 4:
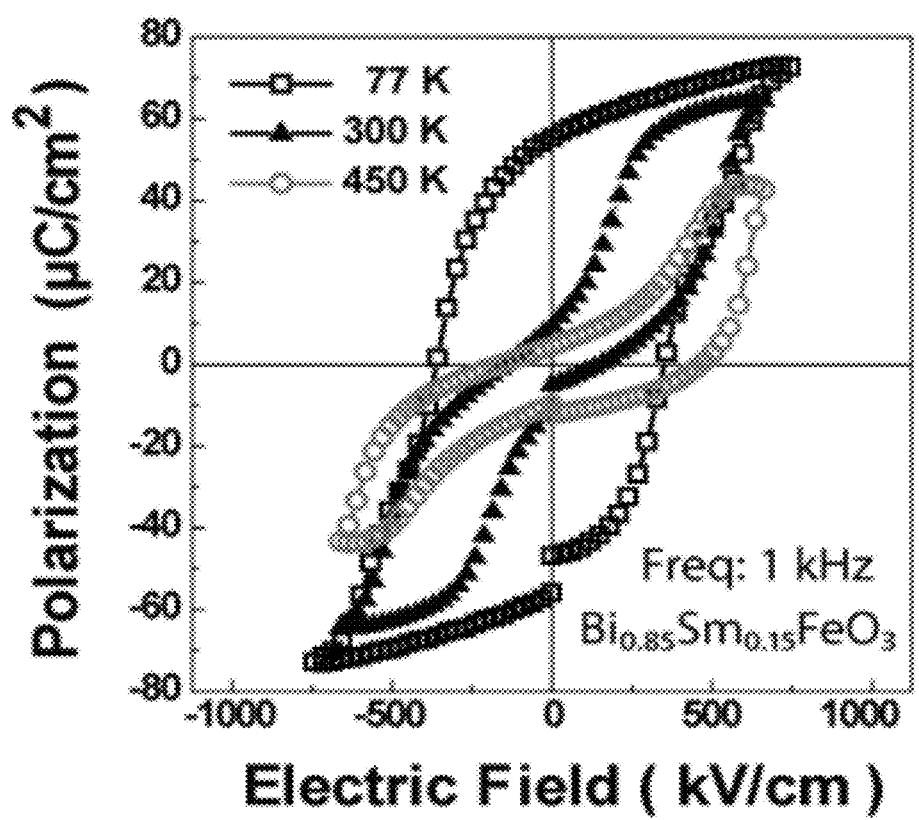
FIG. 4 illustrates continuous change in the ferroelectric hysteresis loops observed as a function of changing composition. Loops are shown for 3 different compositions mea-

Square-shaped ferroelectric hysteresis loops with good saturation and robust switchable polarization are obtained for compositions from x=0 up to $x \approx 0.14$. FIG. 4 plots hysteresis loops for three compositions (BFO, $Bi_{0.86}Sm_{0.14}FeO_3$ and $Bi_{0.84}Sm_{0.16}FeO_3$) selected for displaying the most prominent features. The loops were acquired at 5 KHz at room temperature. Increasing the Sm concentration is noted to induce a large drop in the coercive field (from 420 kV/cm for the pure BFO film to only 160 kV/cm for $Bi_{0.88}Sm_{0.12}FeO_3$) while a high switchable polarization (70 μC/cm²) is maintained. For $x \geq 0.15$, double hysteresis loops are observed, indicative of antiferroelectric behavior (Jona, F. et al. (1962) FERROELECTRIC CRYSTALS, Pergamom, N.Y.). The antiferroelectric composition at $x \approx 0.16$ still maintains a relatively high polarization once the electric field-induced switch to ferroelectric behavior takes place. These hysteresis curves do not vary with time or number of measurements, indicating that the double hysteresis loops are not from domain-wall pinning (see, e.g., Bedau, D. et al. (Epub 2008 Dec. 18) "*Quantitative Determination Of The Nonlinear Pinning Potential For A Magnetic Domain Wall,*" Phys. Rev. Lett. 101(25):256602; Tanigawa, H. et al. (Epub 2008 Nov. 12) "*Dynamical Pinning Of A Domain Wall In A Magnetic Nanowire Induced By Walker Breakdown,*" Phys. Rev. Lett. 101(20):207203; Silevitch, D. M. et al. (2007) "*A Ferromagnet In A Continuously Tunable Random Field,*" Nature 448(7153):567-570; Ma, H. et al. (Epub 2003 Nov. 20) "*Lattice-Scale Domain Wall Dynamics In Ferroelectrics,*" Phys. Rev. Lett. 91(21): 217601).

The dramatic changes in the structure and polarization behavior as a function of Sm concentration in BFO are also reflected in the dielectric constant and the electromechanical behaviors. In FIG. 5 the maximum out-of-plane dielectric constant ($\epsilon_{33}$) and loss tangent measured at 10 kHz is plotted as a function of increasing Sm concentration. The dielectric constant reaches a maximum at x=0.14 in agreement with the structural transition taking place. The loss tangent at this composition is relatively low (~0.01), as also observed in bulk. (Mathe, V. L. (2003) "*Structural, Dielectric and Electrical Properties of $Sm_xBi_{1-x}FeO_3$ Ceramics*," J. Magn. Magn. Mater. 263:344-352).

FIG. 6A plots the high field effective out-of-plane piezoelectric coefficient ($d_{33}$) loops measured via a quantitative piezoresponse force microscopy (PFM) as a function of the Sm doping. Around x=0.13~0.15, the effective $d_{33}$ displays a rapid increase peaking at x=0.14 with 110 pm/V. Beyond this value, it drastically decreases to ~55 pm/V for $Bi_{0.83}Sm_{0.17}FeO_3$. Raleigh analysis (Troiler-McKinstry, N. B. et al. (2006) "*Piezoelectric Nonlinearity Due To Motion Of 180° Domain Walls In Ferroelectric Materials At Subcoercive Fields: A Dynamic Poling Model*," Appl. Phys. Lett. 88:202901-1 to 202901-3) of the out-of-plane piezoelectric response for the MPB composition sample confirmed that the signal is not due to any non-180° domain wall motion (data not shown). FIG. 6B compares the piezoelectric behavior of BSFO with x=0.12 and x=0.14 measured via quantitative piezoforce microscopy, performed on Pt/BSFO/SRO/STO structures using Pt—Ir coated contact mode tips (Nagarajan, V. et al. (2002) "*Realizing Intrinsic Piezoresponse In Epitaxial Submicron Lead Zirconate Titanate Capacitors On Si*," Appl. Phys. Lett. 81:4215-4217). The measured $d_{33}$ values are effective values due to the constraint imposed by the underlying substrate. The composition right near the MPB possesses a substantially higher remanent out-of-plane $d_{33}$ (~95 pm/V) together with much reduced coercive field compared to that of x=0.12. The remanent $d_{33}$ for epitaxial (001) oriented $PbZr_{0.52}Ti_{0.48}O_3$ with the same nominal thickness (200 nm) is 100 pm/V (Nagarajan, V. et al. (2002) "*Realizing Intrinsic Piezoresponse In Epitaxial Submicron Lead Zirconate Titanate Capacitors On Si*," Appl. Phys. Lett. 81:4215-4217). BSFO at this MPB is thus a strong candidate as a Pb-free piezoelectric material.

The measured remanent and high field $d_{33}$ are comparable to values previously reported for epitaxial thin films of Pb-based compounds such as PZT and $PbMg_{1/3}Nb_{2/3}O_3$-$PbTiO_3$. Domain engineered single crystals are known to exhibit enhanced electromechanical properties due to extrinsic mechanisms which are absent in thin films (Troiler-McKinstry, N. B. et al. (2006) "*Piezoelectric Nonlinearity Due To Motion Of 180° Domain Walls In Ferroelectric Materials At Subcoercive Fields: A Dynamic Poling Model*," Appl. Phys. Lett. 88:202901-1 to 202901-3). Thus, in comparing nominally similar thin-film samples of the same thickness, the MPB discovered herein exhibits intrinsic piezoelectric properties which are ideal. An added advantage of the present invention is a simpler crystal chemistry than some of the reported lead-free compounds, with greater ease of processing (Saito et al. (2004) "*Lead-Free Piezoceramics*," Nature 432:84-86).

$Bi_{1-x}Sm_xFeO_3$ thin film materials also exhibit a marked transition from the ferroelectric (FE) to the anti-ferroelectric (AFE) state. For example, FIG. 6C shows an abrupt change in the $d_{33}$ loop shape as one crosses from the ferroelectric to the antiferroelectric composition for the $Bi_{0.84}Sm_{0.16}FeO_3$ composition. The dependence of $d_{33}$ on the applied electric field due to intrinsic domain reversal (i.e. no contributions from ferroelastic motion or field-induced phase transition) along the [001] direction can be described using the formula:

$$d_{33}(E) = 2\overline{Q}P(E)\epsilon_{33}(E) \quad (1)$$

where $P(=P_3)$ is the polarization and $\epsilon_{33}$ is the relative dielectric constant. $\overline{Q}$ is an effective electrostrictive coefficient that accounts for the clamping effect of the substrate. This phenomenological relation states that the field dependence of the $d_{33}$ coefficient is principally governed by the field dependence of the polarization as well as the dielectric susceptibility. The main features of the antiferroelectric $d_{33}$ loop are consistent with the P-E loop (FIG. 4). The non-dashed, black arrows in FIG. 6C indicates the region in which the electric field-induced transition from antiferroelectric to ferroelectric behavior is taking place. The eventual maximum in the $d_{33}$ loop is a consequence of the increase in the switching polarization in the ferroelectric state with a sharp positive change of the slope of the P-E loop and increase in the dielectric susceptibility at that point. As the applied electric field increases further, an inflection point is reached, beyond which the net increment in switchable polarization begins to decrease. As a consequence, the dielectric susceptibility and thus, the $d_{33}$ decreases (FIG. 6C, gray arrow). At higher electric field values, the polarization is fully switched and now similar to a "fully saturated state" in a standard ferroelectric. Here, the drop in the dielectric susceptibility with increasing electric field dominates the shape of the $d_{33}$ loop, which shows a downward slope (FIG. 6C, dashed black arrow).

These results show that $Sm^{+3}$ substituted BFO has unique properties compared to La (Zhang et al. (2006) "*Substitution-induced phase transition and enhanced multiferroic properties of $Bi_{1-x}La_xFeO_3$ ceramics*," Appl. Phys. Lett. 88:162901-1 to 162901-3) or Nd (Uchida et al. (2006) "*Crystal Structure And Ferroelectric Properties Of Rare-Earth Substituted $BiFeO_3$ Thin Films*," J. Appl. Phys. 100:014106-1 to 014106-9; Yuan et al. (2006) "*Structural Transformation And Ferroelectromagnetic Behavior In Single-Phase $Bi_{1-x}Nd_xFeO_3$ Multiferroic Ceramics*," Appl. Phys. Lett. 89:052905-1 to 052905-5) doped BFO. $Sm^{+3}$ has a much smaller ionic size (1.24 Å) than $La^{+3}$ (1.36 Å). The Goldschmidt tolerance factor (Grinberg, I. et al. (2005) "*Predicting Morphotropic Phase Boundary Locations And Transition Temperatures In Pb- And Bi-Based Perovskite Solid Solutions From Crystal Chemical Data And First Principles Calculations*," J. Appl. Phys. 98:094111-1 to 094111-10) for the $Sm^{+3}$ doped BFO is less than 1, and lower symmetry structures are more likely at the MPB. The presence of a low symmetry phase at the MPB is expected to enhance the piezoelectric properties, as the polarization vector is no longer constrained to lie along a symmetry axis, but instead can rotate within a suitable plane (Guo, R. et al. (2000) "*Origin Of The High Piezoelectric Response In $PbZr_{1-x}Ti_xO_3$*," Phys. Rev. Lett. 84:5423-5426; Fu, H. et al. (2000) "*Polarization Rotation Mechanism For Ultrahigh Electromechanical Response in Single-Crystal Piezoelectrics*," Nature 403:281-283).

Ravindran et al. ((2006) "*Theoretical Investigation Of Magnetoelectric Behavior In $BiFeO_3$*," Phys. Rev. B. 74:224412-1 to 224412-18) have shown that BFO undergoes a rhombohedral (R3c) to orthorhombic (Pnma) structural transition under pressure. Because of its small ionic radius, chemical pressure due to continuous $Sm^{+3}$ doping may be viewed as resulting from similar lattice instabilities.

The FE to AFE transition in BSFO thin films is both composition and temperature dependent. FIG. 7 shows the continuous change in the antiferroelectric hysteresis loops as a function of temperature for $Bi_{0.85}Sm_{0.15}FeO_3$. Loops are shown for 3 different temperatures. The composition undergoes an AFE to FE transition as the temperature is lowered. Similarly, FIGS. 8A-8B. FIG. 8A shows the temperature-induced FE-AFE transition in $Bi_{0.877}Sm_{0.123}FeO_3$ thin films. At room temperature, the material exhibits typical FE hysteresis. As temperature is increased, AFE double-hysteresis is seen. FIG. 8B shows the temperature at which this FE to AFE transition takes place for different concentrations of Sm doping.

EXAMPLE 3

Figure 2C:
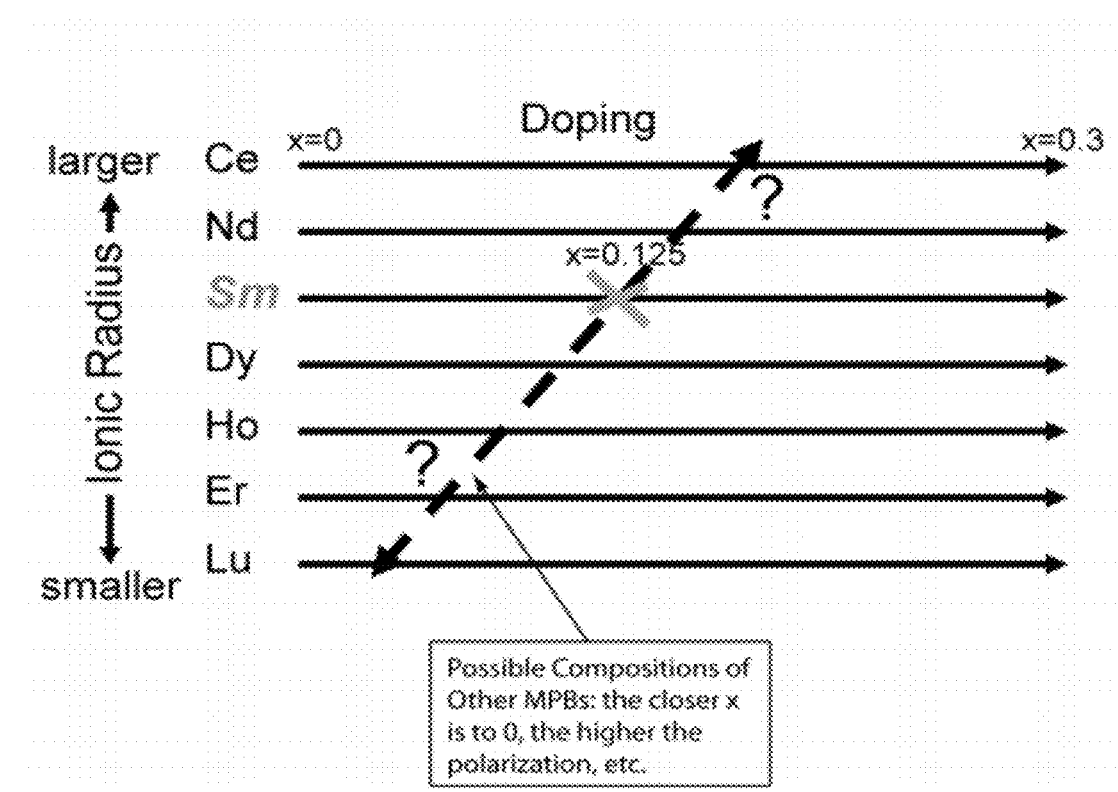

Characterization of Ferroelectric/Piezoelectric Properties of $Bi_{1-x}(Dy, Gd)_xFeO_3$ Compositions As seen in Example 2, materials comprising $Bi_{1-x}Sm_xFeO_3$ show enhanced piezoelectric properties relative to La or Nb due to the decreased ionic radius of Sm relative to these dopants. The presence of a low symmetry phase at the MPB is expected to enhance the piezoelectric properties (Guo, R. et al. (2000) "*Origin Of The High Piezoelectric Response In $PbZr_{1-x}Ti_xO_3$*," Phys. Rev. Lett. 84:5423-5426; Fu, H. et al. (2000) "*Polarization Rotation Mechanism For Ultrahigh Electromechanical Response in Single-Crystal Piezoelectrics*," Nature 403:281-283). Dy and Gd both have substantially smaller ionic radii (1.05 Å and 1.08 Å, respectively) than La, Nb or Sm, and therefore, $Bi_{1-x}(RE)_xFeO_3$ materials comprising these elements are expected to exhibit further enhanced piezoelectric properties than those comprising Sm. FIG. 2C shows the expected change in MPB compositions as ionic radius size decreases. As ionic radius size decreases, less dopant is required, resulting in more Bi present in the materials. As Bi is the source of the material's ferroelectric behavior, it is expected that less doping would result in greater polarization, and thus, enhanced piezoelectricity.

Similar to the thin films generated for Example 2, a series of pseudobinary composition spread epitaxial thin-film libraries (200 nm thick) are fabricated on $SrTiO_3$ (STO (100)) substrates 6 mm long by the combinatorial pulsed laser deposition system (Pascal, Inc.) at 600° C., where a pseudobinary compositional phase diagram of $Bi_{1-x}(RE)_xFeO_3$ or $BiFe_{1-y}(TM)_yO_3$ is continuously mapped on each chip. RE and TM denote rare earth and transition metal cations, respectively. Composition variation across the spreads are confirmed by an electron probe (JEOL JXA-8900), and the uncertainty in the composition at each point on the spread is +/−1.5%. Scanning X-ray micro-diffraction (Bruker D8 Discover) is performed with a 0.5 mm diameter aperture. For electrical characterization, an epitaxial $SrRuO_3$ (SRO) layer (50 nm) is used as the bottom electrode, and a sputter-deposited to Pd layer (50 nm) is patterned into 50 μm capacitor dots. Ferroelectric polarization hysteresis loops are obtained using the Radiant Precision LC at 5 kHz. Quantitative piezoresponse force microscopy is used to measure the out-of-plane piezoresponse.

To test the structural changes in $Bi_{1-x}(RE)_xFeO_3$ materials doped with varying concentrations of Dy, thin films are prepared and tested as in Example 2. FIG. 9 shows transition of the materials from the FE to the AFE state from the polarization hysteresis loops at Dy concentrations of ~8-11%. The effect of A site doping with varying concentrations of Sm, Dy and GD in $Bi_{1-x}(RE)_xFeO_3$ materials doped may be tested with thin films prepared as in Example 2. X-ray diffraction results in FIGS. 10A and 10B show that, as predicted by FIG. 2C, the concentration of dopant required decreases as a function of ionic radius size. Dy has the smallest ionic radius of the three dopants, and accordingly shows indications of an MPB at much lower concentrations than for Gd or Sm, as evidenced by the appearance of the (½ 0 2) spots (FIG. 10B) and (¼ 0 7/4) diffraction spots (FIG. 10A). As discussed above, the appearance of these spots indicates a transition to a lower symmetry phase, and thus, enhanced piezoelectric properties. FIG. 10C shows lattice parameter measurements of the three types of $Bi_{1-x}(RE)_xFeO_3$ materials as a function of increasing dopant concentration. As expected, Dy, having the smallest ionic radius, has the lowest value for (c). Similarly, FIG. 10D compares the dielectric constant for the three types of thin films. Dy exhibits the greatest permittivity at the lowest concentration, followed by Gd, then Sm.

All publications and patents mentioned in this specification are herein incorporated by reference to the same extent as if each individual publication or patent application was specifically and individually indicated to be incorporated by reference in its entirety. While the invention has been described in connection with specific embodiments thereof, it will be understood that it is capable of further modifications and this application is intended to cover any variations, uses, or adaptations of the invention following, in general, the principles of the invention and including such departures from the present disclosure as come within known or customary practice within the art to which the invention pertains and as may be applied to the essential features hereinbefore set forth.

What is claimed is:

1. A lead-free piezoelectric ceramic material having the formula:

where Bi is bismuth, Fe is iron, O is oxygen, RE is one or more of: La, Pr, Nd, Pm, Sm, Eu, Gd, Tb, Dy, Ho, Er, Tm, Yb and Lu, and wherein:
$0.125 \leq x \leq 0.3$ for La, Pr, Nd, or Pm;
$0.125 < x \leq 0.3$ for Sm; and
$0 < x \leq 0.3$ for Eu, Gd, Tb, Dy, Ho, Er, Tm, Yb or Lu,
and the composition of said material has an x value that is within 0.010 of the x value of the morphotropic phase boundary of such material.

2. The lead-free piezoelectric ceramic material of claim 1, wherein RE is Sm.

3. The lead-free piezoelectric ceramic material of claim 2, wherein $0.13 < x \leq 0.15$.

4. The lead-free piezoelectric ceramic material of claim 1, wherein said compound has an x value that is within 0.005 of the x value of the morphotropic phase boundary of such material.

5. The lead-free piezoelectric ceramic material of claim 4, wherein said compound has an x value that is within 0.002 of the x value of the morphotropic phase boundary of such material.

6. A device capable of generating a mechanical force in response to a change in an electric field, wherein said device contains a lead-free piezoelectric ceramic material having the formula:

where Bi is bismuth, Fe is iron, O is oxygen, RE is one or more of: La, Pr, Nd, Pm, Sm, Eu, Gd, Tb, Dy, Ho, Er, Tm, Yb and Lu, and wherein:
$0.125 \leq x \leq 0.3$ for La, Pr, Nd, or Pm;
$0.125 < x \leq 0.3$ for Sm; and
$0 < x \leq 0.3$ for Eu, Gd, Tb, Dy, Ho, Er, Tm, Yb or Lu,
and the composition of said material has an x value that is within 0.010 of the x value of the morphotropic phase boundary of such material,
and wherein said response is a piezoresponse.

7. The device of claim 6, wherein RE is Sm.

8. The device of claim 7, wherein $0.13 < x \leq 0.15$.

9. The device of claim 6, wherein said compound has an x value that is within 0.002 of the x value of the morphotropic phase boundary of such material.

10. The device of claim 6, wherein said device is selected from the group consisting of: a piezoelectric motor, a piezoelectric relay; a piezoelectric speaker; a piezoelectric sensor; a piezoelectric ultrasound sonic generator; and a piezoelectric pump.

11. A device capable of generating a change in an electric field in response to a mechanical force, wherein said device contains a lead-free piezoelectric ceramic material having the formula:

$$Bi_{1-x}RE_xFeO_3$$

where Bi is bismuth, Fe is iron, O is oxygen, RE is one or more of: La, Pr, Nd, Pm, Sm, Eu, Gd, Tb, Dy, Ho, Er, Tm, Yb and Lu, and wherein:
$0.125 \leq x \leq 0.3$ for La, Pr, Nd, or Pm;
$0.125 < x \leq 0.3$ for Sm; and
$0 < x \leq 0.3$ for Eu, Gd, Tb, Dy, Ho, Er, Tm, Yb or Lu;
and the composition of said material has an x value that is within 0.010 of the x value of the morphotropic phase boundary of such material,
and wherein said response is a piezoresponse.

12. The device of claim 11, wherein RE is Sm.

13. The device of claim 12, wherein $0.13 < x \leq 0.15$.

14. The device of claim 11, wherein said compound has an x value that is within 0.002 of the x value of the morphotropic phase boundary of such material.

15. The device of claim 11, wherein said device is selected from the group consisting of: a piezoelectric sensor, a piezoelectric battery, a piezoelectric transducer, and a piezoelectric microphone.

* * * * *